United States Patent
Ito et al.

(10) Patent No.: US 7,371,078 B2
(45) Date of Patent: May 13, 2008

(54) INSERT ATTACHABLE TO AN INSERT MAGAZINE OF A TRAY FOR HOLDING AN AREA ARRAY TYPE ELECTRONIC COMPONENT TO BE TESTED

(75) Inventors: Akihiko Ito, Tokyo (JP); Hiroto Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/780,893

(22) Filed: Feb. 19, 2004

(65) Prior Publication Data

US 2005/0036275 A1 Feb. 17, 2005

Related U.S. Application Data

(63) Continuation of application No. PCT/JP02/08378, filed on Aug. 20, 2002.

(30) Foreign Application Priority Data

Aug. 22, 2001 (JP) ............................ 2001-252166

(51) Int. Cl.
*H01R 12/00* (2006.01)
(52) U.S. Cl. ..................................... 439/73
(58) Field of Classification Search ................ 439/74, 439/482, 66, 71, 73; 361/767, 734
See application file for complete search history.

(56) References Cited

U.S. PATENT DOCUMENTS 4,293,175 A * 10/1981 Cutchaw ...................... 439/72

| | | | | |
|---|---|---|---|---|
| 4,331,371 A * | 5/1982 | Ichimura et al. | ......... | 439/269.1 |
| 5,515,241 A * | 5/1996 | Werther | ...................... | 361/784 |
| RE35,733 E * | 2/1998 | Hernandez et al. | ......... | 361/734 |
| 5,742,481 A * | 4/1998 | Murphy et al. | ............. | 361/767 |
| 6,439,897 B1 * | 8/2002 | Ikeya | ........................... | 439/73 |
| 6,651,817 B2 * | 11/2003 | Shim et al. | .................. | 206/726 |
| 6,937,719 B2 * | 8/2005 | Elo | ............................. | 379/398 |
| 7,156,680 B2 * | 1/2007 | Saito | ........................... | 439/331 |

FOREIGN PATENT DOCUMENTS

JP A-11-287842 10/1999
JP A-2001-33519 2/2001

OTHER PUBLICATIONS

International Search Report from Japanese Patent office mailed on Dec. 3, 2002.

* cited by examiner

*Primary Examiner*—Chandrika Prasad
(74) *Attorney, Agent, or Firm*—Posz Law Group, PLC

(57) ABSTRACT

To attain an object of providing an insert for holding wide-ranging kinds of area array type electronic components and realizing certain connection between external terminals of an area array type electronic component and connection terminals of a socket, and an electronic component testing apparatus and an electronic component testing method using the same, a thin plate 163 for supporting an IC device 2 is positioned between an external terminal face 23 of the IC device 2 and a connection terminal face 42 of a socket 40, and a thickness of the thin plate 163 is made to be approximately equal to or less than a distance between a tip portion of the external terminals 22 and the external terminal face 23.

14 Claims, 18 Drawing Sheets

INSERT ATTACHABLE TO AN INSERT MAGAZINE OF A TRAY FOR HOLDING AN AREA ARRAY TYPE ELECTRONIC COMPONENT TO BE TESTED

TECHNICAL FIELD

The present invention relates to an electronic component holder (insert) capable of holding an electronic component to be tested while conducting a test on the electronic component by an electronic component testing apparatus, and an electronic component handling apparatus and an electronic component testing method using the same.

BACKGOUND ART

In a production process of semiconductor devices, etc., an electronic component testing apparatus is necessary for testing performance and functions, etc. of IC devices (hereinafter, also simply referred to as "ICs") and other electronic components. As an example of an electronic component testing apparatus as such, an electronic component testing apparatus configured by an electronic component handling apparatus, an electronic component contact apparatus and a main testing apparatus is known.

As an example of the electronic component handling apparatus, there is known an IC device handling apparatus called a handler for applying a variety of temperature stress, such as a low temperature and high temperature, to an IC device to be tested, mounting the device on a socket, then classifying and holding the IC device to be tested in accordance with the test result. As an example of the electronic component contact apparatus, an IC device contact apparatus for bringing an IC device to be tested to contact (be electrically connected to) a main testing apparatus via a socket and a test head is known.

A test of an IC device using the handler is conducted, for example, as below. The IC device to be tested is, after being conveyed to above a test head provided with an IC socket, pressed by a pusher so as to be loaded on the IC socket. As a result, connection terminals of the IC socket contact external terminals of the IC device to be tested, and the IC device to be tested is electrically connected to the main testing apparatus through the IC socket and the test head. Then, a test signal supplied from the main testing apparatus to the test head through a cable is applied to the IC device to be tested and a response signal read from the IC device to be tested is sent to the main testing apparatus through the test head, so that electrical characteristics of the IC device to be tested are measured.

In the test of IC devices by using a handler, IC devices to be tested are held on a tray to be conveyed to inside the handler and, after the test is completed, the IC devices are reloaded to categorically separated trays in accordance with the respective test results. When a type of a tray to hold the IC devices before and after the test (hereinafter, also referred to as a "customer tray") and that of the tray to circularly convey inside the handler (hereinafter, also referred to as a "test tray") are different, the IC devices are reloaded between the customer tray and the test tray before and after the test.

A plurality of electronic component holders called inserts are provided on the test tray and the IC devices to be tested are held in the inserts provided on the test tray, conveyed to the test head and pressed against the test head while held in the inserts. By using the test tray with a plurality of the inserts, a large number of IC devices can be measured at a time.

There are a variety of configurations in the inserts corresponding to package types, etc. of the IC devices to be tested. For example, when the IC device to be tested is an area array type electronic component, such as a BGA type IC device, the insert 16 is formed with an IC magazine 19 for holding the IC device to be tested 2 as shown in FIG. 15, and an opening portion is formed at the lower end of the IC magazine 19 so that external terminals 22 of the IC device 2 are exposed to connection terminals 44 of a socket 40. At the rim of the opening portion, a supporting portion 191 for supporting the external terminal face (the face on which the external terminals are arranged among outer surfaces of the package body of the IC device 2) of the IC device 2 is provided, and the IC device 2 is supported and held in the IC magazine 19 by the supporting portion 191.

As shown in FIG. 16(a), when the connection terminals 44 protruding from the socket 40 is long, the supporting portion 191 of the insert 16 does not interfere with the socket 40 when the external terminals of the IC device 2 are connected to the connection terminals 44 of the socket 40. However, when the connection terminals are long, electric resistance of the connection terminals increases, so that a reduction of the test time becomes difficult and high speed processing on the IC devices to be tested becomes difficult. Particularly, when conducting a high frequency test, it is necessary that the length of the connection terminals of the socket is made as short as possible.

On the other hand, as shown in FIG. 16(b), when the connection terminals 44 protruding from the socket 40 is short, the supporting portion 191 of the insert 16 interferes with the socket 40, so that connection between the external terminals 22 of the IC device 2 and the connection terminals 44 of the socket 40 is liable to be hindered.

Thus, as shown in FIG. 17, to prevent the contact between the supporting portion 191 of the insert 16 and the socket 40, an allowance room for the supporting portion 191 of the insert 16 is formed on the socket 40. Namely, a space S is formed around the connection terminal face (the face on which the connection terminals are protruding among outer surfaces of the socket body) of the socket 40, and the space S becomes an allowance room for the supporting portion 191 to slip in. At this time, by making a size of the opening portion formed at the lower end of the IC magazine 19 larger than the connection terminal face of the socket 40, the supporting portion 191 can slip into the space S formed around the connection terminal face of the socket 40.

However, when making the size of the opening portion formed at the lower end of the IC magazine 19 larger than the connection terminal face of the socket 40, the external terminal face of the IC device 2 supported by the supporting portion 191 inevitably becomes larger than the connection terminal face of the socket 40. Namely, when forming a space for the supporting portion to slip in around the connection terminal face of the socket, the configuration of the supporting portion (for example, a size, shape and position at the insert, etc.) is constrained by the configuration (for example, a size and shape, etc.) of the connection terminal face of the socket. As a result, kinds of IC devices capable of being held in the insert are constrained by the configuration of the connection terminal face of the socket.

Also, since electric resistance of connection terminals is small in a sheet shaped socket using anisotropic conductive rubber, it is considered that high speed processing on the IC device becomes possible. But when using a sheet shaped socket on which the connection terminals are not protruding (or almost not protruding), it is difficult to provide a space for the supporting portion to slip in around the connection terminal face of the socket.

DISCLOSURE OF THE INVENTION

A first object of the present invention is to provide an insert, wherein a kind of an area array type electronic component to be held is not constrained by the configuration (for example, a size and shape, etc.) of a connection terminal face of a socket, so that wide-ranging kinds of area array type electronic components can be held, and an electronic component handling device and an electronic component test method using the same.

Also, a second object of the present invention is to provide an insert capable of realizing certain connection of external terminals of an area array type electronic component and connection terminals of a socket without causing interference between a supporting portion and a connection terminal face of the socket even if a space for the supporting portion supporting the external terminal face of the area array type electronic component to slip in is not provided at a rim of the connection terminal face of the socket when connecting the external terminals of the area array type electronic component and the connection terminals of the socket, and an electronic component handling apparatus and an electronic component test method using the same.

(1) To attain the above object, the present invention provides an insert comprising a supporting portion for supporting an external terminal face of an area array type electronic component so that external terminals of the area array type electronic component are exposed to the direction of connection terminals of a socket, wherein a thickness of the supporting portion is approximately equal to or less than a distance between a contact portion of the external terminals of the area array type electronic component and the external terminal face of the area array type electronic component, and the supporting portion is provided to be positioned between the external terminal face of the area array type electronic component and the connection terminal face of the socket when the external terminals of the area array type electronic component and the connection terminals of the socket are connected.

In the present invention, the "insert" means an electronic component holder capable of holding an electronic component to be tested while conducting a test on the electronic component by an electronic component testing apparatus, and the configuration is not particularly limited as far as it has the characteristic point of the insert according to the present invention.

An electronic component as an object of the insert according to the present invention is an area array type electronic component (hereinafter, also simply referred to as "an electronic component"). The "area array type electronic component" means an electronic component wherein external terminals are arranged (for example, in matrix) on an outer surface of a package body of the electronic component, and the kind is not particularly limited. As representative examples thereof, IC devices of BGA (ball grid array), LGA (land grid array), PGA (pin grid array) and CSP (chip size package), etc. may be mentioned. Also, a shape of the external terminal of the area array type electronic component is not particularly limited and, for example, external terminals having a ball, land or pin shape may be mentioned.

In the present invention, the "external terminal face of an area array type electronic component" means a face on which external terminals are arranged among outer surfaces of a package body of the area array type electronic component, and "to expose the external terminals of the area array type electronic component in the direction of connection terminals" includes, as far as the external terminals of the electronic component are exposed in the direction of the connection terminals of the socket, the case where the external terminals of the electronic component are protruding from the external terminal face, and the case where the external terminals of the electronic component are scarcely protruding from the external terminal face of the electronic component.

Also, the "connection terminal face of a socket" means a face on which connection terminals are exposed among outer surfaces of the socket body, and the "connection terminal face of a socket" includes a face on which connection terminals are exposed but scarcely protruding (or not at all protruding) among the outer surfaces of the socket body. Namely, a face on which an electronic component is electrically connected to the socket when being in contact with the external terminals of the electronic component is included in the "connection terminal face". As an example of a socket having a connection terminal face as such, a sheet shaped socket using anisotropic conductive rubber may be mentioned. Also, the "socket" includes those having any configuration as far as it comprises connection terminals to be electrically connected to the external terminals of the area array type electronic component. For example, even a wiring substrate like a socket board etc. is also included in the "socket" as far as pads thereof directly contact the external terminals of the area array type electronic component to be electrically connected. In this case, the pads of the wiring substrate correspond to the "connection terminals of the socket".

In an insert according to the present invention, the configuration of the supporting portion is not particularly limited as far as it can support the external terminal face of the area array type electronic component, so that the external terminals of the area array type electronic component are exposed in the direction of the connection terminals of the socket.

In an insert according to the present invention, a thickness of the supporting portion is approximately equal to or less than a distance between a contact portion of the external terminals of the area array type electronic component and the external terminal face of the area array type electronic component. Here, the "thickness of the supporting portion" means a thickness from the external terminal face of the area array type electronic component to the direction of the connection terminals of the socket. The thickness of the supporting portion may be suitably adjusted in accordance with a length of the external terminals of the area array type electronic component. The thickness of the supporting portion is not necessarily constant and, for example, in the case where a distance between the contact portion of the external terminals of the area array type electronic component and the external terminal face of the area array type electronic component differs between respective external terminals because the area array type electronic component has a plurality of external terminals of different lengths, the thickness of the supporting portion may be changed between respective portions. Also, the "contact portion of the external terminals" means a portion to be in contact with the connection terminals of the socket when connecting the external terminals of the area array type electronic component and the connection terminals of the socket. Generally, a tip portion of the external terminal is the "contact portion of the external terminal". Also, the "approximately equal" includes other than the case where the thickness of the supporting portion is equal to a distance between the contact portion of the external terminals of the area array type electronic component and the external terminal face of the area array type electronic component, the case where the thickness is more than that distance (consequently, the external terminals of the electronic component are not connected to the connection terminals of the socket in that state) but connection between the external terminals of the electronic component and the connection terminals of the socket can be attained as a result of pressing the electronic component in the direction of the connection terminals of the socket. For example, when the supporting portion has a certain degree of elasticity, a pressing force to the electronic component is applied to the supporting portion supporting the electronic component and the supporting portion becomes thinner due to the pressing force, so that the external terminals of the electronic component can be connected to the connection terminals of the socket.

In the insert according to the present invention, the supporting portion is provided to be positioned between the external terminal face of the area array type electronic component and the connection terminal face of the socket when the external terminals of the area array type electronic component and the connection terminals of the socket are connected. The "positioned between the external terminal face of the area array type electronic component and the connection terminal face of the socket" includes the case where the supporting portion positions in a state of being in contact only with the external terminal face of the area array type electronic component and the case where the supporting portion positions in a state of being in contact with both of the external terminal face of the area array type electronic component and the connection terminal face of the socket. In the case where the supporting portion positions in a state of being in contact with both of the external terminal face of the area array type electronic component and the connection terminal face of the socket, a distance between the external terminal face of the area array type electronic component and the connection terminal face of the socket can be controlled by the configuration of the supporting portion (for example, a thickness of the supporting portion in the direction of connection terminals of the socket). Therefore, it is possible to manage strokes of a pusher at the time of mounting the electronic component to be tested to the socket by pressing the electronic component to be tested in the direction of the connection terminals of the socket.

In an insert according to the present invention, the supporting portion does not slip in the space formed around the connection terminal face of the socket, but positions between the external terminal face of the area array type electronic component and the connection terminal face of the socket at the time of connecting the external terminals of the area array type electronic component and the connection terminals of the socket, so that the configuration of the supporting portion (for example, a size, shape, position at insert, etc.) is free from constraint by the configuration of the connection terminal face of the socket (for example, a size and shape, etc.). Namely, according to the insert according to the present invention, the configuration of the connection terminal face of the socket does not constrain a kind of an area array type electronic component to be held in the insert, and wide-ranging kinds of area array type electronic components can be held.

Also, in an insert according to the present invention, since the thickness of the supporting portion is approximately equal to or less than the distance between the contact portion of the external terminals of the area array type electronic component and the external terminal face of the area array type electronic component, and the contact portion of the external terminals of the area array type electronic component held and supported by the insert according to the present invention is in a state of being exposed to the outside of the insert or in a state of being enabled to be exposed (that is, when the thickness of the supporting portion is thinner than the above distance, the contact portion of the external terminals of the electronic component is in a state of being exposed to the outside of the insert, while when the thickness of the supporting portion is approximately equal to the above distance, the contact portion of the external terminals of the electronic component is in a state of being enabled to be exposed to the outside of the insert, for example, by pressing the electronic component in the direction of the connection terminals of the socket), certain connection of the external terminals of the area array type electronic component and the connection terminals of the socket can be realized without causing interference between the supporting portion and the connection terminal face of the socket even if a space for the supporting portion supporting the external terminal face of the area array type electronic component to slip in is not provided around the connection terminal face of the socket.

(2) In a preferred embodiment of the insert according to the present invention, the supporting portion is configured by a thin plate. The "thin plate" means a plate wherein a thickness of the supporting portion in the direction of connection terminals of the socket is thin, and the thickness of the "thin plate" can be suitably adjusted in a range of not hindering the connection between the external terminals of the electronic component and the connection terminals of the socket. According to the insert according to the present embodiment, when the supporting portion positions between the external terminal face of the area array type electronic component and the connection terminal face of the socket, the connection between the external terminals of the electronic component and the connection terminals of the socket is not hindered due to interference with the socket, so that certain connection can be realized between the external terminals of the electronic component and the connection terminals of the socket.

(3) In a preferred embodiment of the insert according to the present invention, a plate member comprising the supporting portion is provided to the insert so as to face the connection terminal face of the socket. As a result, an electronic component can be stably supported and held in the insert. The plate member may be configured by a flat plate having an approximately uniform thickness or may be configured by a plurality of flat plate members having different thicknesses.

(4) In the insert according to the above embodiment, it is preferable that a supporting portion part or whole of the plate member is configured by a thin plate. Due to this, even when the supporting portion positions between the external terminal face of the area array type electronic component and the connection terminal face of the socket, the connection between the external terminals of the electronic component and the connection terminals of the socket is not hindered by interference with the socket, so that certain connection can be realized between the external terminals of the electronic component and the connection terminals of the socket. It is sufficient if at least a part corresponding to the supporting portion is configured by a thin plate in the plate member, but preferably, only the part of the supporting portion is configured by a thin plate and the remaining portion is configured by a plate member having a thickness capable of keeping sufficient strength as an insert (for example, being resistible against pressure from the pusher).

(5) In the insert according to the above embodiment, it is preferable that the plate member has an opening portion for exposing the external terminals of the area array type electronic component to the direction of the connection terminals of the socket, and can support the external terminal face of the area array type electronic component by a rim of the opening portion. Due to this, an electronic component can be stably supported and held in the insert, and certain connection can be realized between the external terminals of the electronic component and the connection terminals of the socket. A size, number and position, etc. of the opening portion are not particularly limited as far as it is possible to support the external terminal face of the electronic component by the rim of the opening portion.

(6) In the insert according to the above embodiment, it is preferable that the rim of the opening portion of the plate member is configured by a thin plate. Due to this, even when the rim of the opening portion supporting the external terminal face of the electronic component positions between the eternal terminal face of the area array type electronic component and the connection terminal face of the socket, the connection between the external terminals of the electronic component and the connection terminals of the socket is not hindered due to interference with the socket, so that certain connection can be realized between the external terminals of the electronic component and the connection terminals of the socket.

(7) In the insert according to the above embodiment, it is preferable that the plate member is attached to an insert body as a separate member from the insert body. A thickness of the plate member can be more easily and accurately adjusted when forming the plate member separately than when forming the insert comprising the plate member as a unit. Accordingly, by attaching to the insert body the separately formed plate member as a separate member from the insert body, the thickness of the supporting portion of the insert can be made thin and the thickness of the supporting portion between inserts can be equalized.

(8) In the insert according to the above embodiment, the plate member is preferably a metal plate. A kind of the metal composing the metal plate is not particularly limited, but stainless for springs, stainless, aluminum, copper, iron, etc. may be mentioned as specific examples thereof, and the stainless for springs and stainless are preferable among them. Since a metal plate has a constant elasticity, breaking of the socket due to contact of the metal plate and the socket can be prevented. Also, by applying a metal plate as the plate member, the thickness of the plate member can be easily and accurately adjusted. Furthermore, when the metal plate contacts both of the external terminal face of the electronic component and the connection terminal face of the socket, heat transfer between the electronic component and the socket is efficiently performed through the metal plate, a temperature difference between the electronic component and the socket can be eliminated, and contact failure between the electronic component and the socket due to difference of the thermal expansion coefficients can be prevented. Furthermore, a temperature rise due to self-heating of the electronic component to be tested can be prevented by the heat transfer through the metal plate. When applying a metal plate as the plate member, it is preferable that the thin plate is subjected to insulation processing, so that the plate member may contact the external terminals of the electronic component and the connection terminals of the socket.

(9) In a preferable embodiment of an insert according to the present invention, the insert is attached to a tray for carrying an electronic component to be tested to and from a contact portion of a test head of an electronic component testing apparatus. A contact portion of the test head of the electronic component testing apparatus is provided with a socket for loading an electronic component to be tested, where a test of the electronic component to be tested is conducted. According to the insert according to the present embodiment, carrying of the electronic component to be tested to the contact portion, a test of the electronic component to be tested at the contact portion, and carrying of the electronic component after tested out from the contact portion can be performed efficiently. Also, by providing a plurality of inserts on a tray, a plurality of electronic components can be tested at a time.

(10) To attain the above object, the present invention provides an electronic component handling apparatus for conducting a test on an area array type electronic component by connecting external terminals of the area array type electronic component with connection terminals of a socket in a state of holding the area array type electronic component in an insert, comprising the insert according to the present invention.

The electronic component handling apparatus according to the present invention is provided with the insert according to the present invention as its insert, the effects and efficiencies by the insert according to the present invention explained above can be brought out.

(11) In a preferable embodiment of the electronic component handling apparatus according to the present invention, the socket is a sheet shaped socket. Since connection terminals are not protruding (or scarcely protruding) on the sheet shaped socket, the electric resistance is small. Therefore, according to the electronic component handling apparatus of the present invention, a reduction of a test time of electronic components and high speed processing become possible. The electronic component handling apparatus according to the present embodiment is particularly useful for a high frequency test of electronic components.

(12) To attain the above object, the present invention provides an electronic component testing method for conducting a test on an area array type electronic component, comprising supporting an external terminal face of the area array type electronic component by a rim of an opening portion of a plate member having the opening portion, pressing the area array type electronic component in the direction of connection terminals of a socket in a state that external terminals of the area array type electronic component are exposed from the opening portion to the direction of the connection terminals of the socket, and connecting the external terminals of the area array type electronic component with the connection terminals of the socket, wherein a thickness of the rim of the opening portion of the plate member is approximately equal to or less than a distance between a contact portion of the external terminals of the area array type electronic component and the external terminal face of the area array type electronic component, and the plate member is positioned between the external terminal face of the area array type electronic component and the connection terminal face of the socket when the external terminals of the area array type electronic component and the connection terminals of the socket are connected.

The electronic component testing method according to the present invention can be performed by using an insert according to the present invention, and effects and efficiency by the insert according to the present invention explained above can be brought.

BEST MODE FOR CARRYING OUT THE INVENTION

Below, preferred embodiments of the present invention will be explained based on the drawings.

Figure 1:
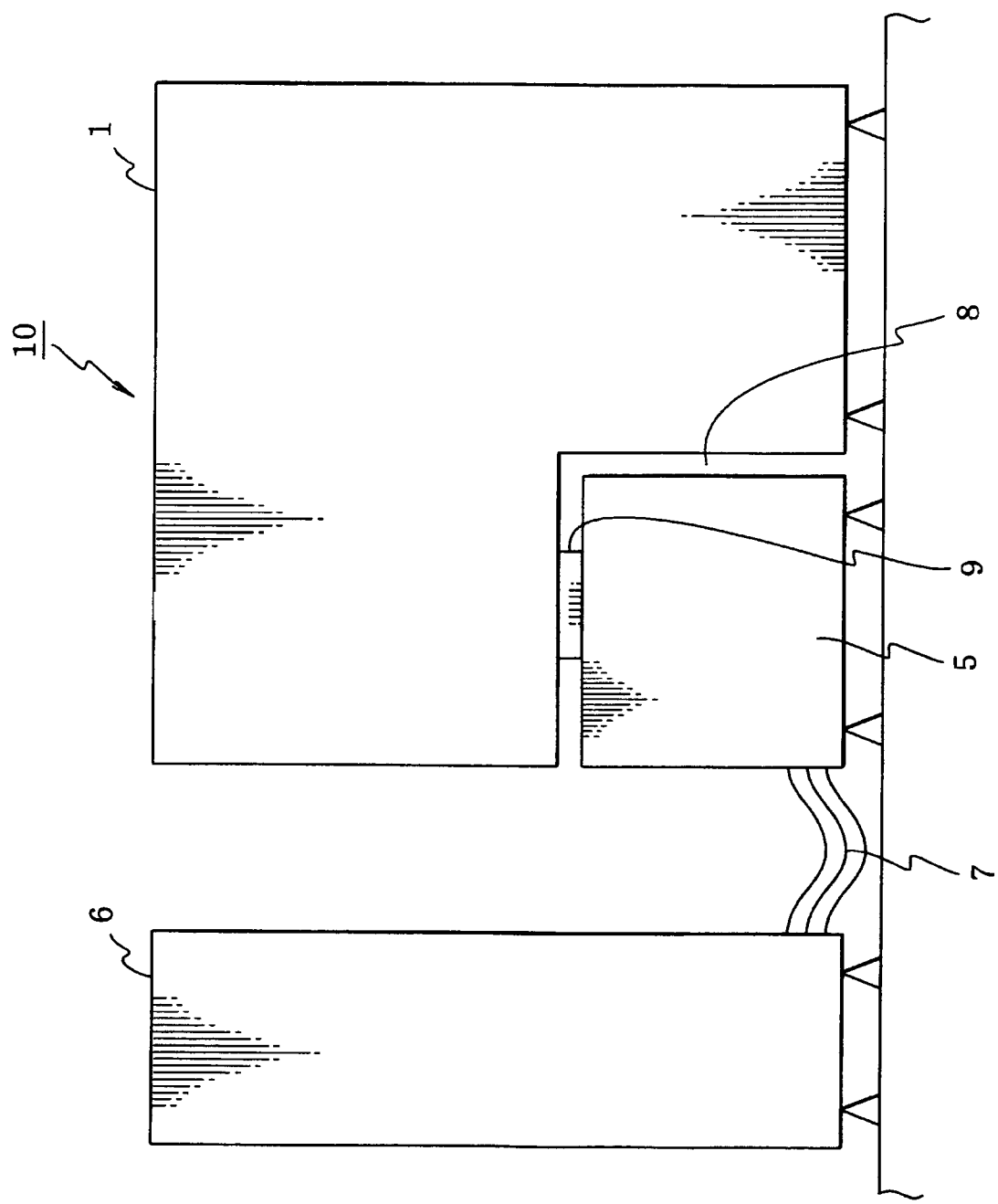
FIG. 1 is an overall view from the side showing an IC device testing apparatus comprising an IC device handling apparatus as an embodiment of an electronic component handling apparatus according to the present invention.
Figure 2:
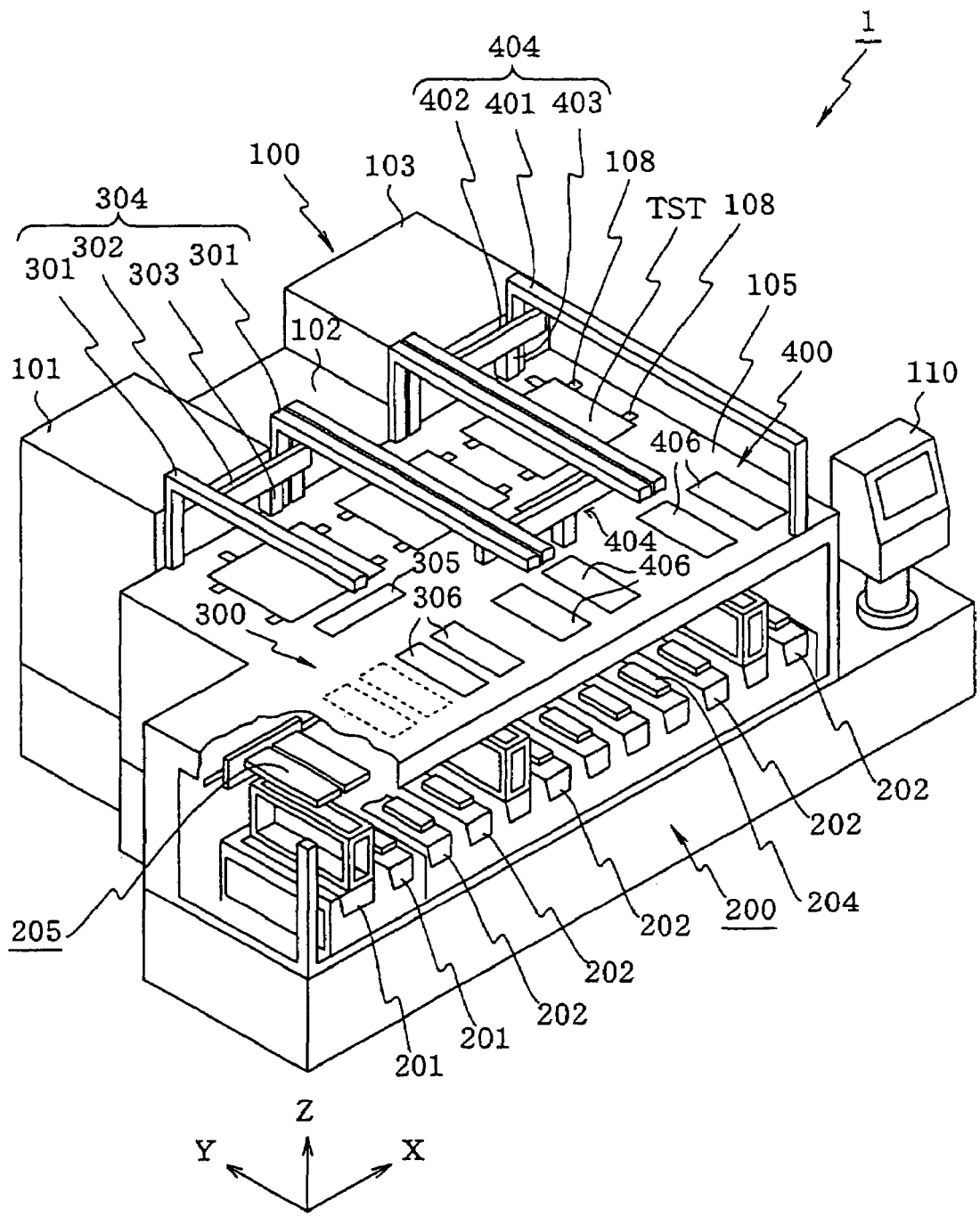
FIG. 2 is a perspective view showing a handler in the IC device testing apparatus.
Figure 3:
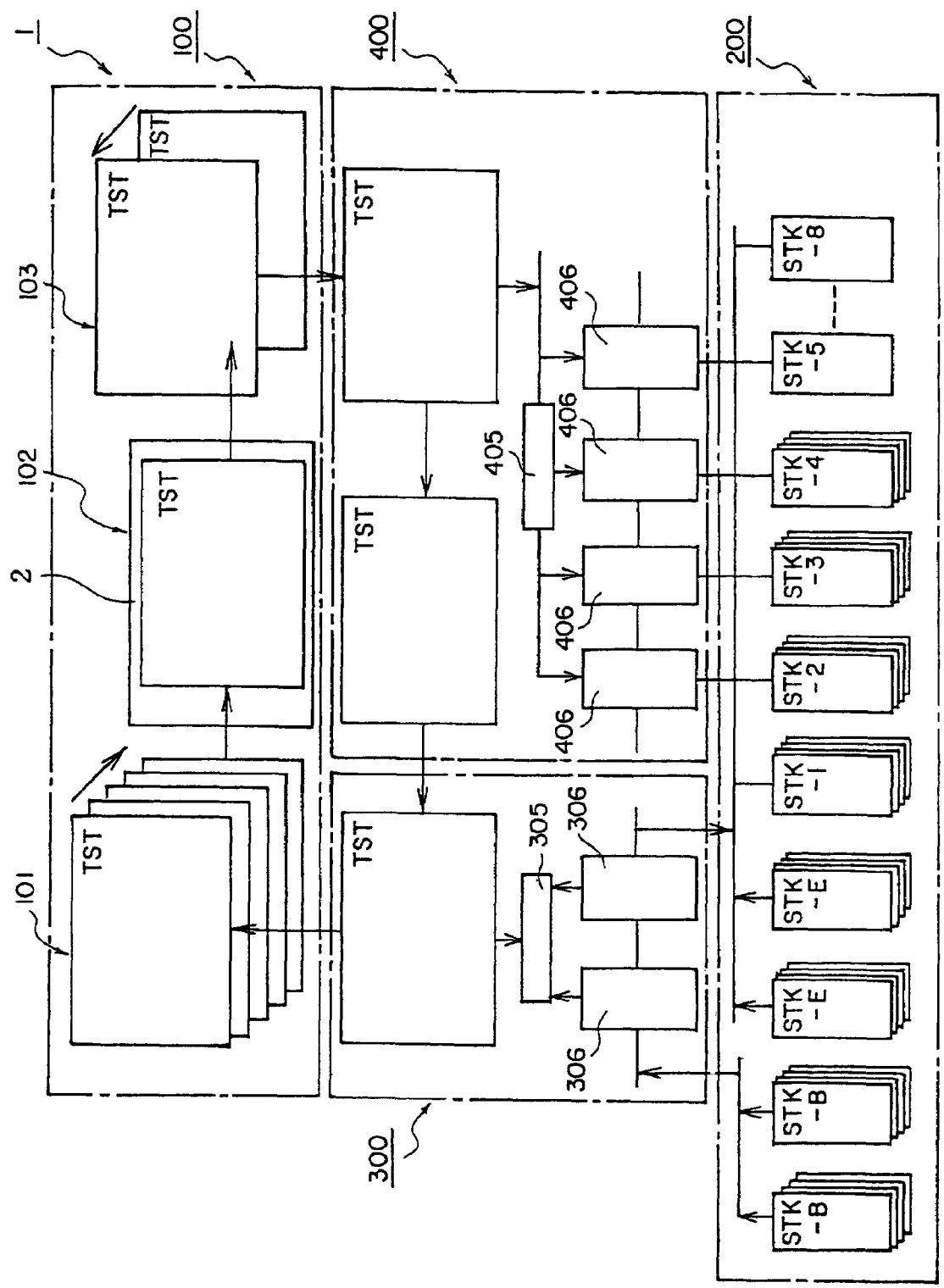
FIG. 3 is a flowchart of a tray showing a method of handling IC devices to be tested.
Figure 4:
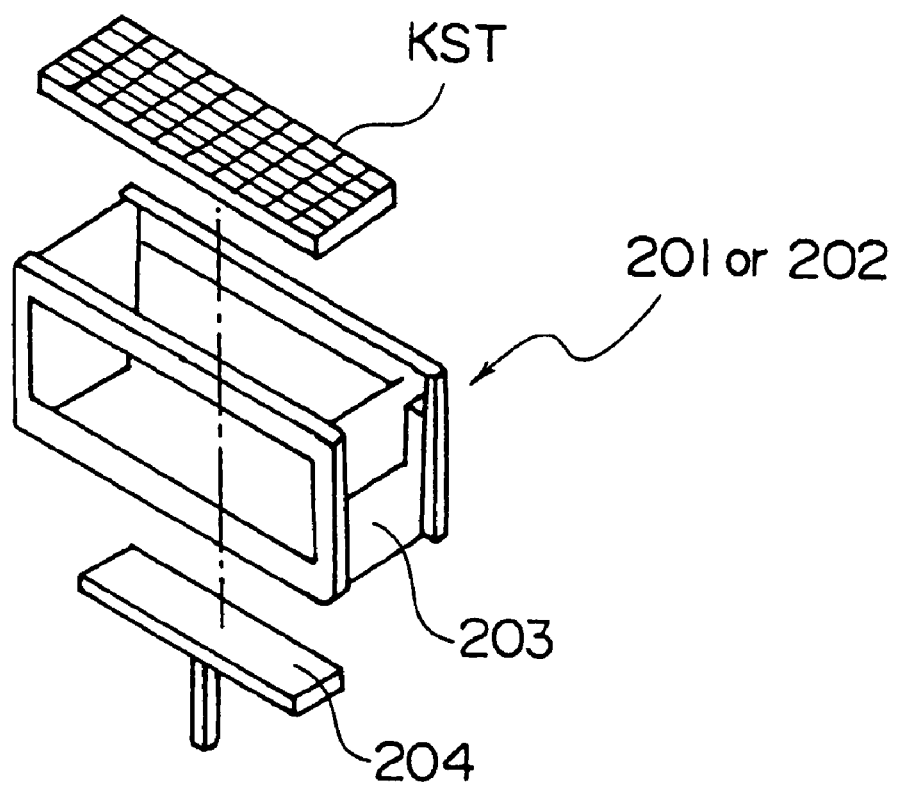
FIG. 4 is a perspective view of the configuration of an IC stocker in the IC device testing apparatus.
Figure 5:
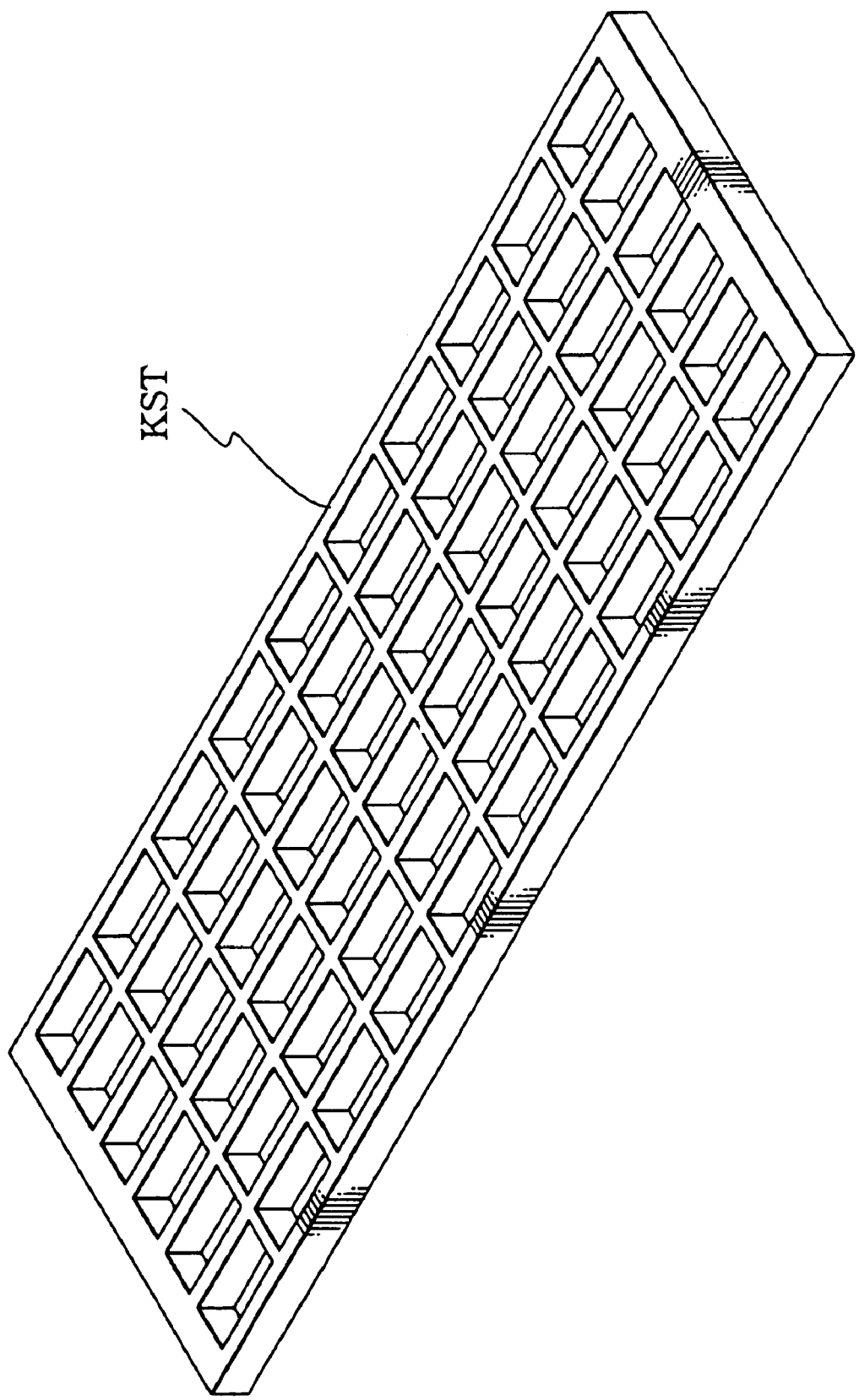
FIG. 5 is a perspective view of a customer tray used in the IC device testing apparatus.
Figure 6:
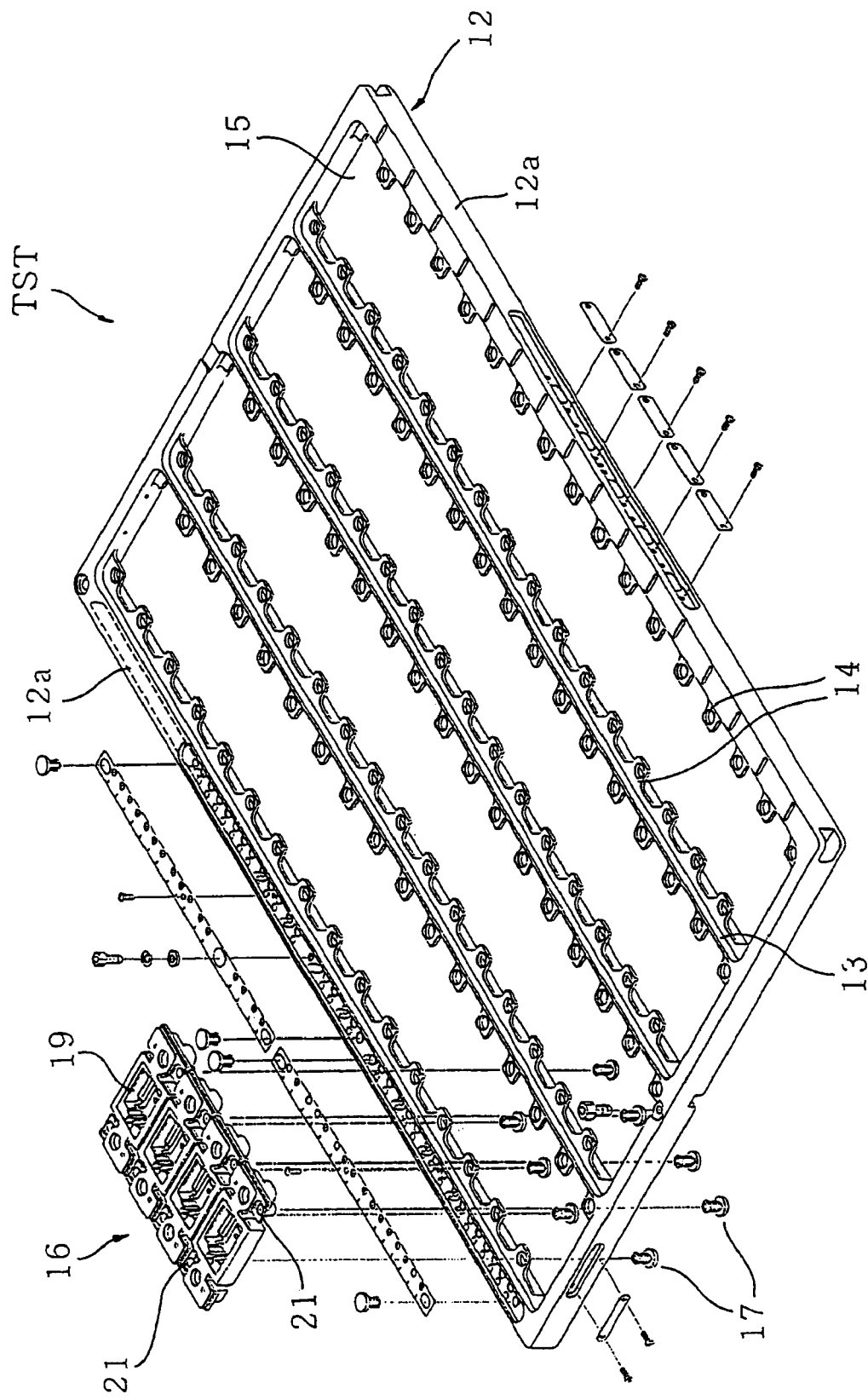
FIG. 6 is a partially disassembled perspective view of a test tray used in the IC device testing apparatus.
Figure 7:
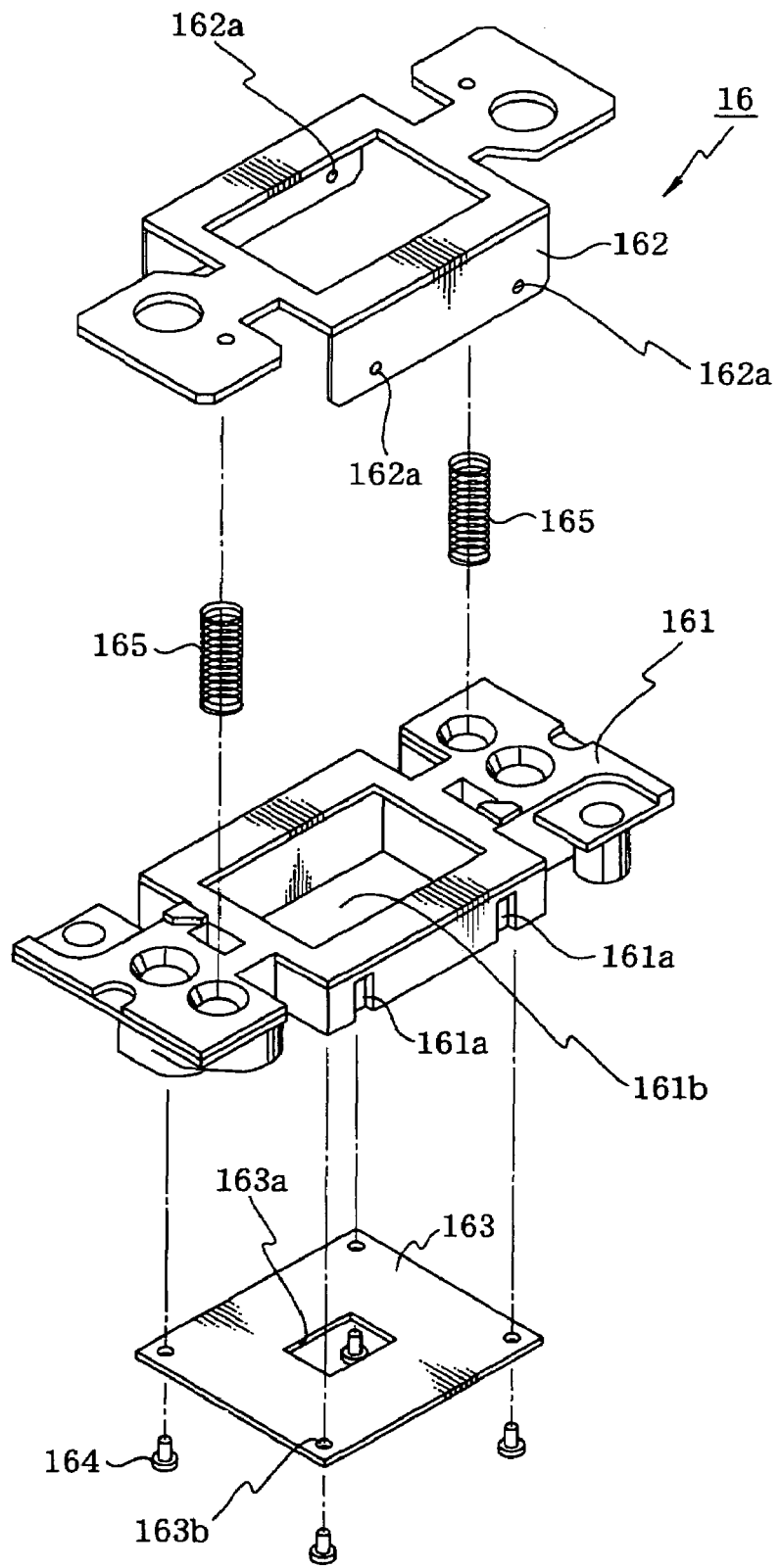
FIG. 7 is a disassembled perspective view of an insert in the IC device testing apparatus.
Figure 8:
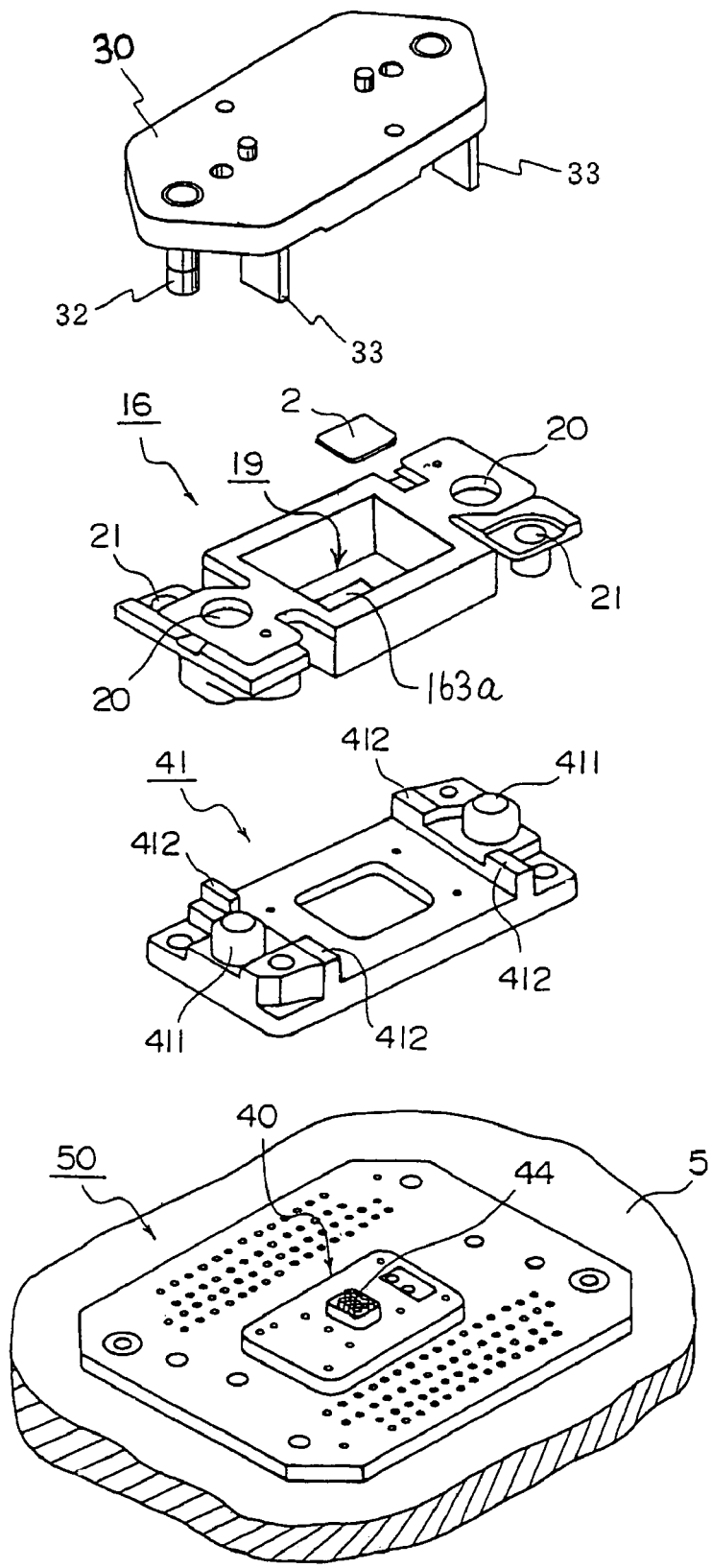
FIG. 8 is a disassembled perspective view showing the configuration around a socket in a test head of the IC device testing apparatus.
Figure 9:
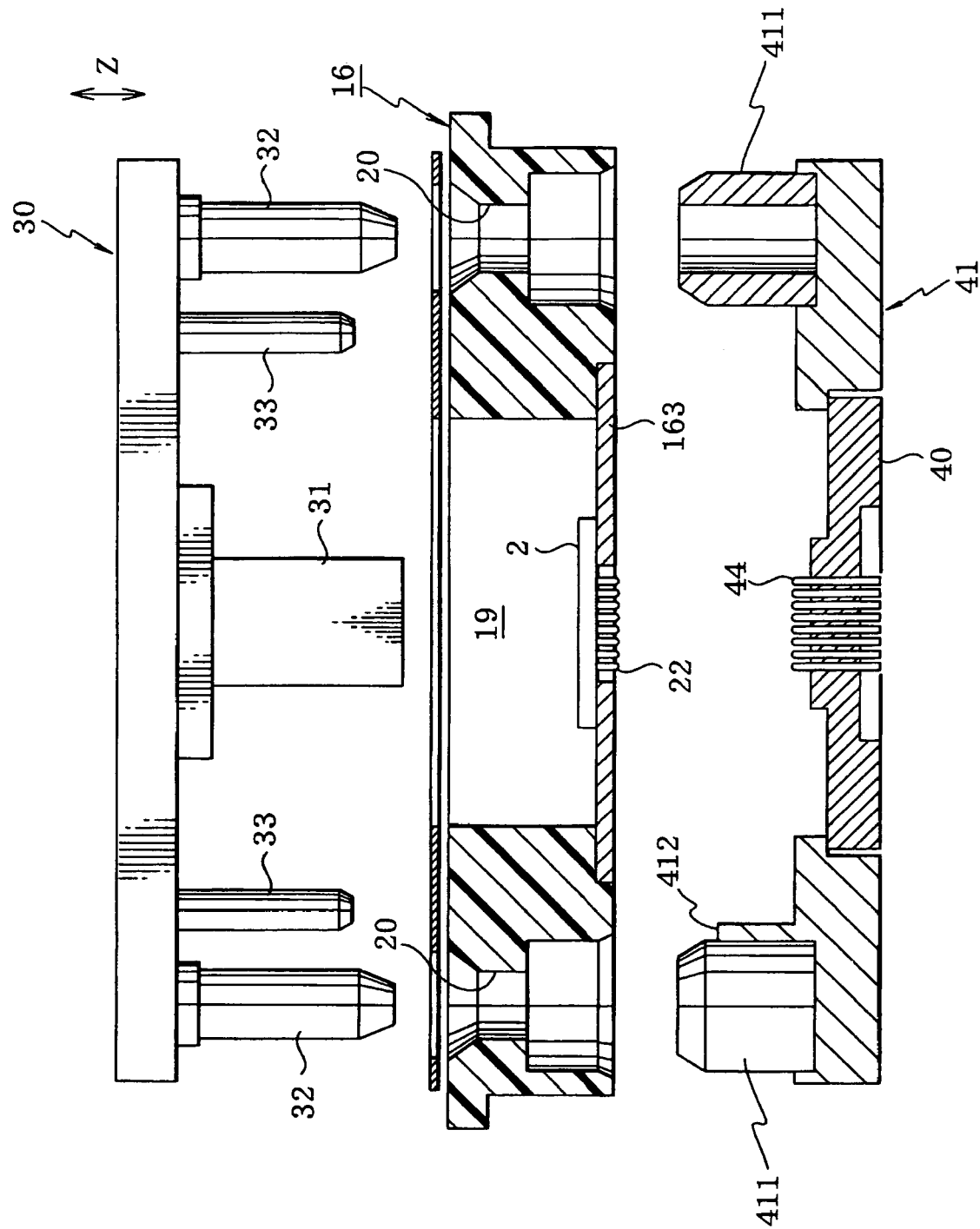
FIG. 9 is a sectional view of a part showing the configuration around a socket in a test head of the IC device testing apparatus.
Figure 10:
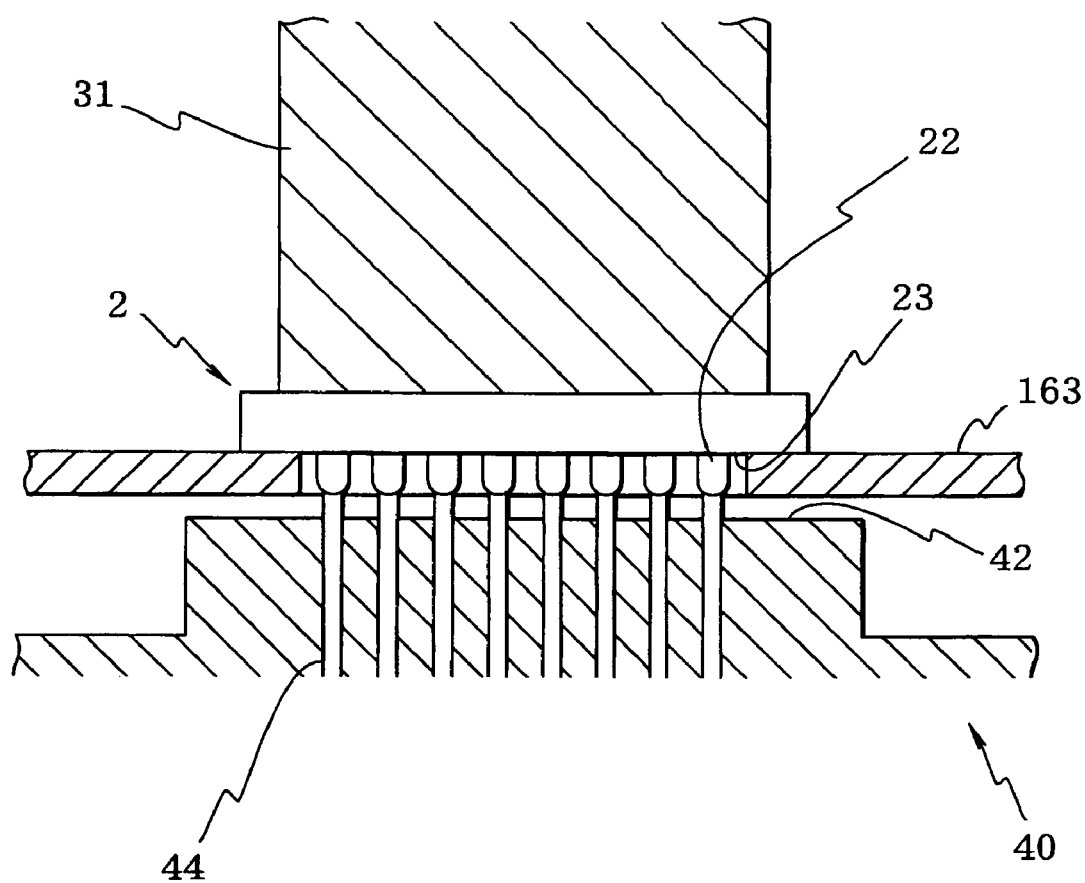
FIG. 10 is a sectional view of a part showing a connection state of external terminals of the IC device and connection terminals of the socket.
Figure 11:
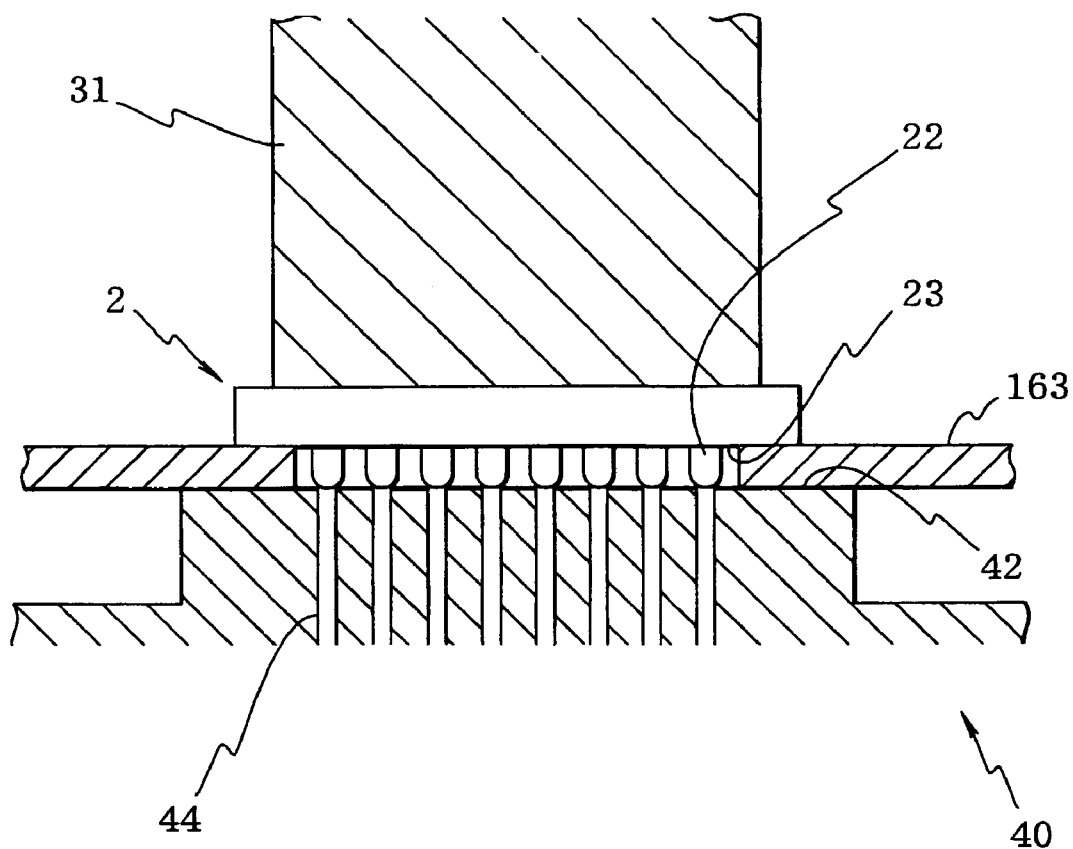
FIG. 11 is a sectional view of a part showing a connection state of external terminals of the IC device and connection terminals of the socket.

FIG. 1 is an overall view from the side showing an IC device testing apparatus comprising an IC device handling apparatus (hereinafter, referred to as a "handler") as an embodiment of an electronic component handling apparatus according to the present invention, FIG. 2 is a perspective view showing a handler in the IC device testing apparatus, FIG. 3 is a flowchart of a tray showing a method of handling IC devices to be tested, FIG. 4 is a perspective view of the configuration of an IC stocker in the IC device testing apparatus, FIG. 5 is a perspective view of a customer tray used in the IC device testing apparatus, FIG. 6 is a partially disassembled perspective view of a test tray used in the IC device testing apparatus, FIG. 7 is a disassembled perspective view of an insert in the IC device testing apparatus, FIG. 8 is a disassembled perspective view showing the configuration around a socket in a test head of the IC device testing apparatus, FIG. 9 is a sectional view of a part showing the configuration around a socket in a test head of the IC device testing apparatus, and FIG. 10 and FIG. 11 are sectional views of a part showing a connection state of external terminals of the IC device and connection terminals of the socket.

Note that FIG. 3 is a view for understanding a method of handling IC devices to be tested in the IC device testing apparatus according to the present embodiment and partially shows by a plan view members actually arranged in the vertical direction. Therefore, the mechanical (three-dimensional) structure will be explained with reference to FIG. 2.

First, an overall configuration of the IC device testing apparatus according to the present embodiment will be explained.

As shown in FIG. 1, an IC device testing apparatus 10 according to the present embodiment comprises a handler 1, a test head 5 and a main testing device 6. The handler 1 performs operations of successively conveying IC devices as electronic components to be tested to sockets of a contact portion 9 provided on top of the test head 5, sorting tested IC devices in accordance with test results and storing to predetermined trays. The IC devices to be tested by the IC device testing apparatus 10 are BGA, LGA, PGA, CSP and other area array type IC devices.

The sockets of the contact portion 9 are electrically connected to the main testing device 6 through the test head 5 and a cable 7, and the IC devices detachably mounted on the sockets are electrically connected to the main testing device 6 through the test head 5 and the cable 7. The IC devices mounted on the sockets are applied test electric signals from the main testing device 6, response signals read from the IC devices are sent to the main testing device 6 through the cable 7, and thereby, performance and functions, etc. of the IC devices are tested.

At a lower portion of the handler 1, a control apparatus for mainly controlling the handler 1 is built in and a space portion 8 is provided at a part thereof. The test head 5 is arranged in this space portion 8 in a freely exchangeable way, and IC devices can be attached to and detached from the sockets of the contact portion 9 provided on top of the test head 5 through holes formed on the handler 1.

The IC device testing apparatus 10 is an apparatus for testing IC devices as electronic components to be tested in a higher temperature state and a lower temperature state than a normal temperature, and the handler 1 has a chamber 100 composed of a constant temperature chamber 101, a test chamber 102 and an unsoak chamber 103 as shown in FIG. 2 and FIG. 3. The contact portion 9 provided on top of the test head 5 shown in FIG. 1 is inserted to inside the test chamber 102, where a test of the IC devices is conducted.

As shown in FIG. 2 and FIG. 3, the handler 1 in the IC device testing apparatus 10 comprises an IC magazine 200 for holding pre-test IC devices and classifying and holding post-test IC devices, a loader section 300 for transferring IC devices to be tested sent from the IC magazine 200 to the chamber 100, a chamber 100 including the test head 5 and an unloader section 400 for classifying and taking out IC devices tested in the chamber 100. Note that the IC devices are held on the test tray while being conveyed in the handler 1.

A large number of the IC devices are held on the customer tray KST shown in FIG. 5 before being held in the handler 1, supplied in that state to the IC magazine 200 of the handler 1 shown in FIG. 2 and FIG. 3, where the IC devices are reloaded from the customer tray KST to the test tray TST (refer to FIG. 6) to be conveyed in the handler 1. Inside the handler 1, as shown in FIG. 3, the IC devices are moved in a state of being loaded on the test tray TST, given a thermal stress of a high temperature or a low temperature for testing (inspecting) whether or not they operate appropriately and sorted in accordance with the test result. Below, inside of the handler 1 will be explained individually in detail.

First, a part relating to the IC magazine 200 will be explained.

As shown in FIG. 2, the IC magazine 200 is provided with a pre-test IC stocker 201 for holding IC devices before tested and a post-test IC stocker 202 for holding IC devices classified in accordance with the test results.

These pre-test IC stocker 201 and post-test IC stocker 202 comprise, as shown in FIG. 4, a frame-shaped tray support frame 203 and an elevator 204 able to enter from under the tray support frame 203 and move toward the top. The tray support frame 203 supports a plurality of stacked customer trays KST, and only the stacked customer trays KST are moved up and down by the elevator 204.

The pre-test IC stocker 201 shown in FIG. 2 holds stacked customer trays KST on which the IC devices to be tested are held, while the post-test IC stocker 202 holds stacked customer trays KST on which IC devices finished being tested are classified.

Note that since the pre-test IC stocker 201 and the post-test IC stocker 202 are structured the same or substantially the same, a pre-test IC stocker 201 can be used as a post-test IC stocker 202, and the opposite case is also possible. Accordingly, the number of the pre-test stocker 201 and the number of the post-test IC stocker 202 can be easily changed in accordance with need.

As shown in FIG. 2 and FIG. 3, in the present embodiment, two stockers SKT-B are provided as the pre-test IC stocker 201 and provided next to that with two empty stockers STK-E as the post-test IC stocker 202 to be sent to the unloader section 400. Furthermore, next to that, eight stockers SKT-1, SKT-2, . . . , SKT-8 are provided as the post-test stocker 202 and configured to be able to hold IC devices sorted into a maximum of eight classes according to the test results. That is, in addition to classifying IC devices as good and defective, it is possible to divide the good IC devices into ones with high operating speeds, ones with medium speeds, and ones with low speeds and the defective IC devices into ones requiring retesting, etc.

Secondary, a part relating to the loader section 300 will be explained.

The customer tray KST held in the tray support frame 203 of the pre-test IC stocker 201 shown in FIG. 4 is conveyed by a tray transfer arm 205 provided between the IC magazine 200 and an apparatus substrate 105 from below the apparatus substrate 105 to an opening 306 of the loader section 300 as shown in FIG. 2. Then, in the loader section 300, IC devices loaded on the customer tray KST are once transferred to a preciser 305 by an X-Y conveyor 304 to correct mutual positions of the IC devices to be tested, then, the IC devices transferred to the preciser 305 are again loaded on the test tray TST stopped in the loader section 300 by using the X-Y conveyor 304.

The X-Y conveyor 304 for reloading IC devices to be tested from a customer tray KST to a test tray TST comprises, as shown in FIG. 2, two rails 301 laid over an apparatus substrate 105, a movable arm 302 able to move back and forth (this direction designated as the Y-direction) between the test tray TST and the customer tray KST by those two rails 301, and a movable head 303 supported by the movable arm 302 and able to move in the X-direction along the movable arm 302.

The movable head 303 of the X-Y conveyor 304 has suction heads attached facing downward. The suction heads move while drawing air to pick up the IC devices to be tested from the customer tray KST and reload the IC devices to be tested on the test tray TST. For example, about eight suction heads are provided for the movable head 303, so it is possible to reload eight IC devices to be tested at a time on the test tray TST.

Thirdly, a part relating to the chamber 100 will be explained.

The above explained test tray TST is loaded with IC devices to be tested at the loader section 300, then sent to the chamber 100, where the respective IC devices are tested in the state of being loaded on the test tray TST.

As shown in FIG. 2 and FIG. 3, the chamber 100 comprises a constant chamber 101 for giving a thermal stress of an objected high temperature or a low temperature to the IC devices to be tested loaded on the test tray TST, a test chamber 102 wherein the IC devices in a state of being given a thermal stress in the constant chamber 101 are mounted on sockets on the test head 5 and tested, and an unsoak chamber 103 for removing the given thermal stress from the IC devices tested in the test chamber 102.

In the unsoak chamber 103, the IC devices are brought back to the room temperature by ventilation when a high temperature was applied in the constant chamber 101, or brought back to a temperature of a degree of not causing condensation by heating with a hot air or a heater, etc. when a low temperature was applied in the constant chamber 101. Then, the IC devices brought to a normal temperature are taken out to the unloader section 400.

As shown in FIG. 2, the constant chamber 101 and the unsoak chamber 103 of the chamber 100 are arranged so as to project upward from the test chamber 102. Also, the constant chamber 101 is provided with a vertical conveyor as shown conceptually in FIG. 3, and a plurality of test trays TST are held by the vertical conveyor to wait until the test chamber 102 becomes available. The IC devices to be tested are applied a thermal stress of a high temperature or a low temperature mainly while waiting here.

A test head 5 is arranged at a lower center portion in the test chamber 102 and the test tray TST is transferred to be on the test head 5, where all IC devices 2 held by the test tray TST shown in FIG. 6 are successively brought to electrically contact with the test head 5, and all IC devices 2 on the test tray TST are tested. On the other hand, the test tray TST finished the test is removed a thermal stress in the unsoak chamber 103 so as to bring the temperature of the IC devices 2 to the room temperature, then, taken out to the unloader section 400 shown in FIG. 2 and FIG. 3.

Also, as shown in FIG. 2, at an upper portion of the constant chamber 101 and the unsoak chamber 103 is formed an inlet opening for taking in the test tray TST from the apparatus substrate 105 and an outlet opening for taking out the test tray TST to the apparatus substrate 105, respectively. The apparatus substrate 105 is attached to test tray conveyors 108 for taking in and out the test tray TST to and from the openings. The conveyor 108 is configured by, for example, a rotation roller, etc. The test tray TST taken out from the unsoak chamber 103 is sent back to the constant chamber 101 via the unloader section 400 and the loader section 300 by the test tray conveyor 108 provided on the apparatus substrate 105.

The test tray TST has a rectangular frame 12 as shown in FIG. 6, and the frame 12 is provided with a plurality of bars 13 in parallel at regular intervals. On both sides of the bars 13 and inside the sides 12*a* of the frame 12 in parallel with the bars 13 are formed a plurality of mounting tabs 14 protruding in the longitudinal direction at regular intervals. Each of insert magazines 15 is composed of two mounting tabs 14 facing to each other among the plurality of mounting tabs 14 provided between the bars 13 and between the bars and the sides 12*a*.

The each of the insert magazines 15 is to hold one insert 16. A mounting hole 21 for the mounting tab 14 is formed at both ends of the insert 16, and the insert 16 is attached to the two mounting tabs 14 in a floating state (a slightly movable state three dimensionally) by using a fastener 17. The inserts 16 are, for example, provided to one test tray TST by the number of 4×16 or so and IC devices to be tested are loaded on the test tray TST as a result that the IC devices to be tested are held in the inserts 16.

In the case where IC devices to be tested are arranged by 4 lines×16 rows as shown in FIG. 6, IC devices to be tested, for example, arranged in every 4 rows in respective lines are tested at a time. Namely, in the first test, 16 IC devices to be tested arranged on the first, fifth, ninth and twelfth rows in respective lines are tested at a time, and in the second test, the test tray TST is moved for an amount of one row and IC devices arranged on the second, sixth, tenth and fifteenth rows are tested at a time. By repeating this, all IC devices to be tested are tested (which is called measuring 16 at a time). A result of the test is stored at an address determined, for example, by an identification number assigned to the test tray TST and a number of ID devices to be tested assigned inside the test tray TST.

Figure 13:
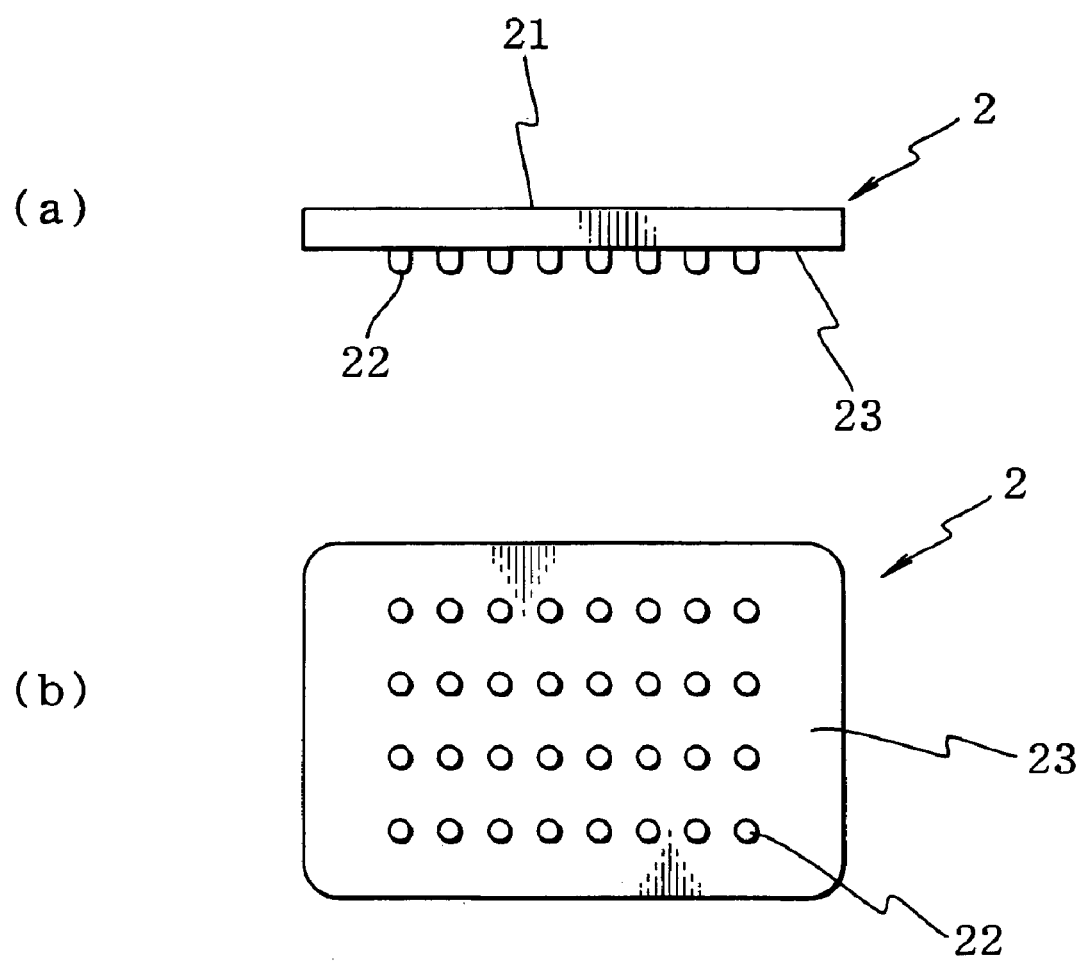
FIG. 13(*a*) is a view form the side of an IC device to be tested by the IC device testing apparatus, and FIG. 13(*b*) is a view from the bottom of the IC device.

An example of IC devices to be tested held in the insert 16 is shown in FIG. 13. FIG. 13(*a*) is a view from the side of the IC device to be tested and FIG. 13(*b*) is a view from the bottom of the IC device to be tested. As shown in FIG. 13, the IC device to be tested 2 is a BGA type IC device having soldering balls as external terminals 22 arranged in matrix on a lower surface 23 of the package body 21. The lower surface 23 of the package body 21 on which the external terminals 22 are arranged corresponds to an external terminal face of the IC device 2.

The insert 16 according to the present embodiment comprises an insert body 161, a lever plate 162 and a rectangular thin plate 163 being formed an opening portion 163*a* at the approximate center thereof, as shown in FIG. 7.

The lever plate 162 is attached to the insert body 161 via a coil spring 165 as shown in FIG. 7 and the lever plate 162 is biased upwardly by the coil spring 165, but the upper limit of an elevating position thereof is controlled as a result that a protruding portion 162*a* formed on the lever plate 162 engages with a recessed portion 161*a* formed on the insert body 161.

A thin plate 163 is attached on the lower end of the insert body 161 as shown in FIG. 7. Since a material of the thin plate 163 is a metal, such as a stainless for springs, stainless, aluminum, copper and iron, it can be easily formed to a desired shape and thickness. When the metal thin plate 163 contacts external terminals 22 of an IC device 2 or connection terminals 44 of a socket 40, a test of the IC device becomes difficult, so that insulation processing is performed on the surface of the thin plate 163.

An attachment hole 163*b* is formed at each of four corner portions of the thin plate 163 as shown in FIG. 7, and the thin plate 163 is attached to the lower end of the insert body 161 by the fasteners 164 through the attachment holes 163*b*. The attachment of the thin plate 163 to the insert body 161 can be also attained by methods of fusion bonding, bonding, screwing and hocking, etc. other than attaching by using fasteners. When the thin plate 163 is attached to the insert body 161 in a removable way, it is easy to exchange the thin plate 163 in accordance with a kind of an IC device to be held in the insert 16.

At the approximate center of the insert body 161 is formed a space 161*b* opening to the above and below and when the thin plate 163 is attached to the lower end of the insert body 161, an IC magazine 19 capable of holding an IC device 2 is formed as shown in FIG. 8 and FIG. 9.

Figure 14:
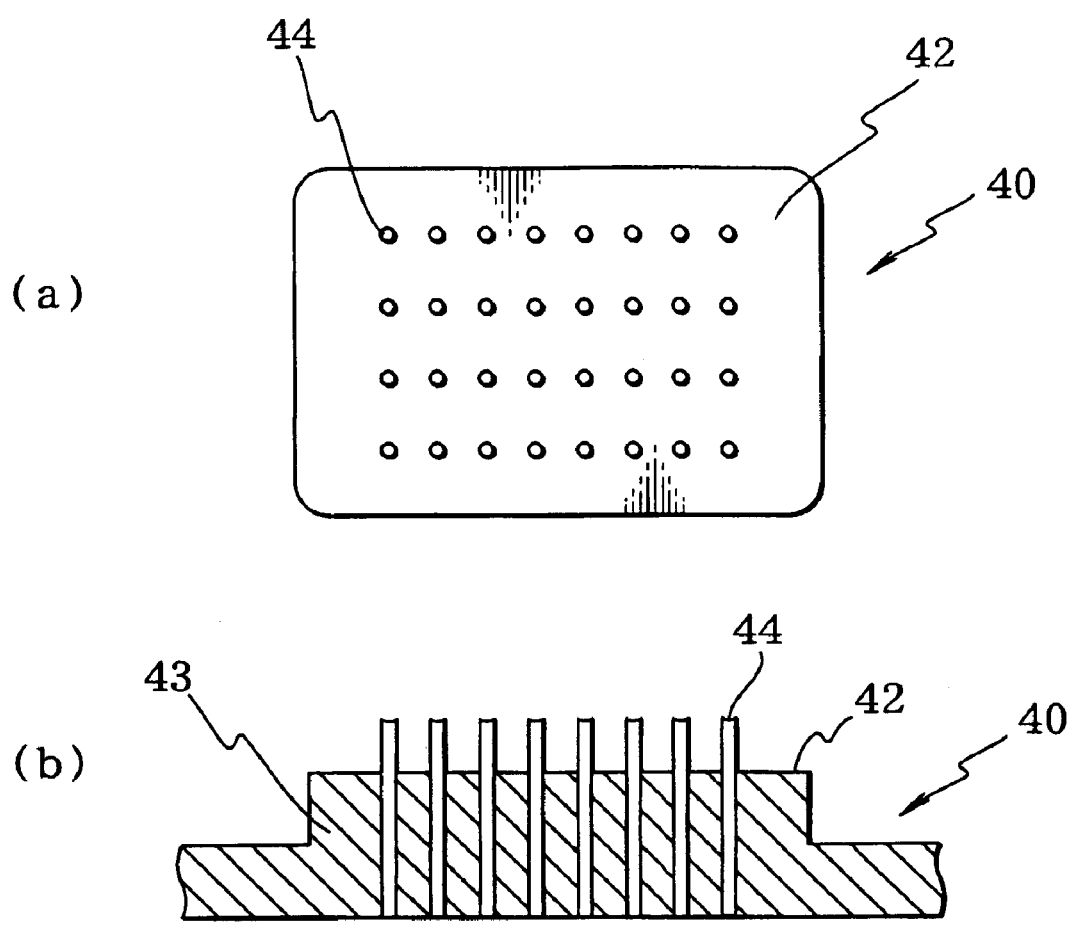
FIG. 14(*a*) is a view from the above in the IC device testing apparatus, and FIG. 14(*b*) is a sectional view of a part of the socket.
Figure 15:
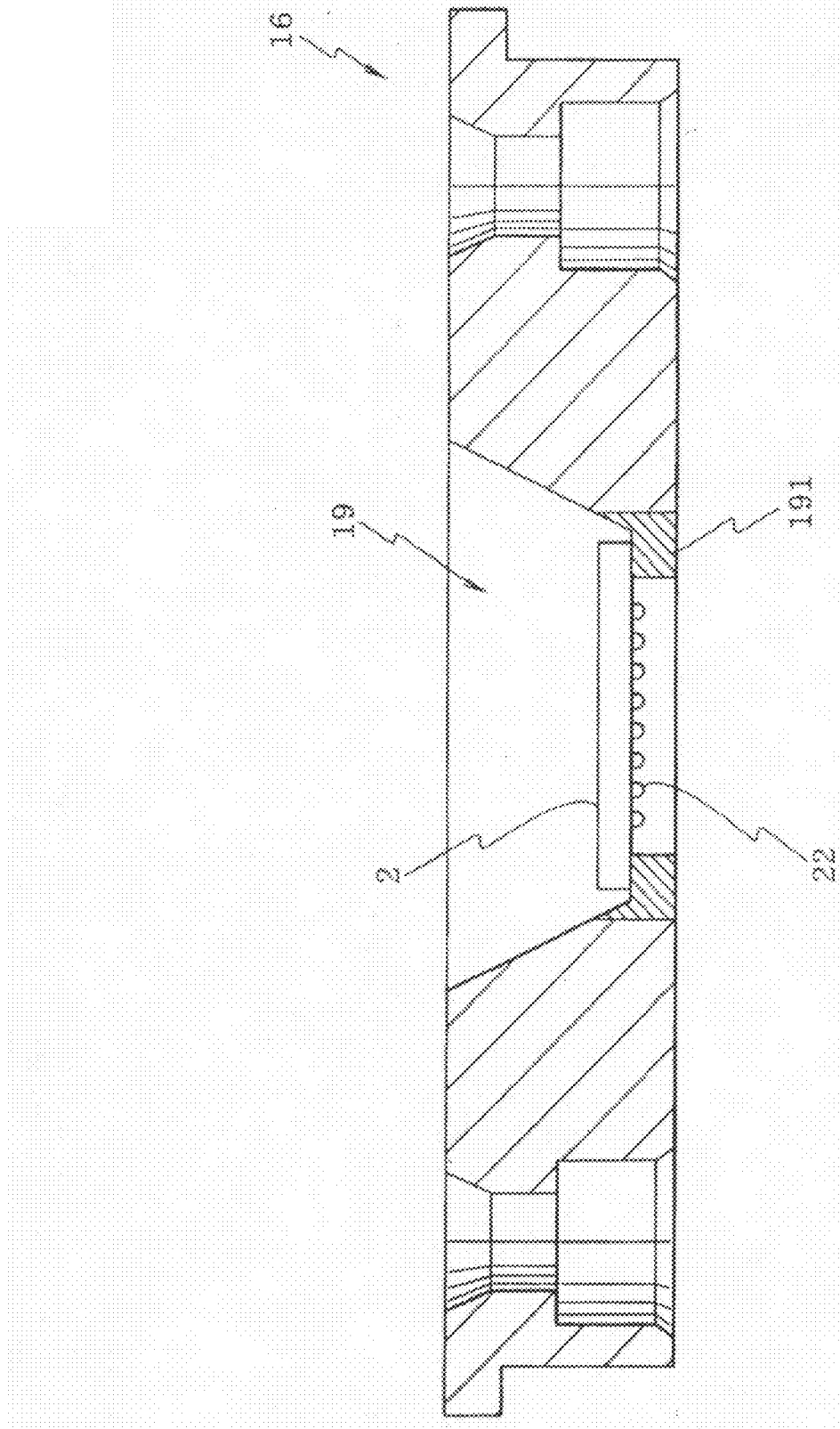
FIG. 15 is a sectional view of a conventional insert.
Figure 16:
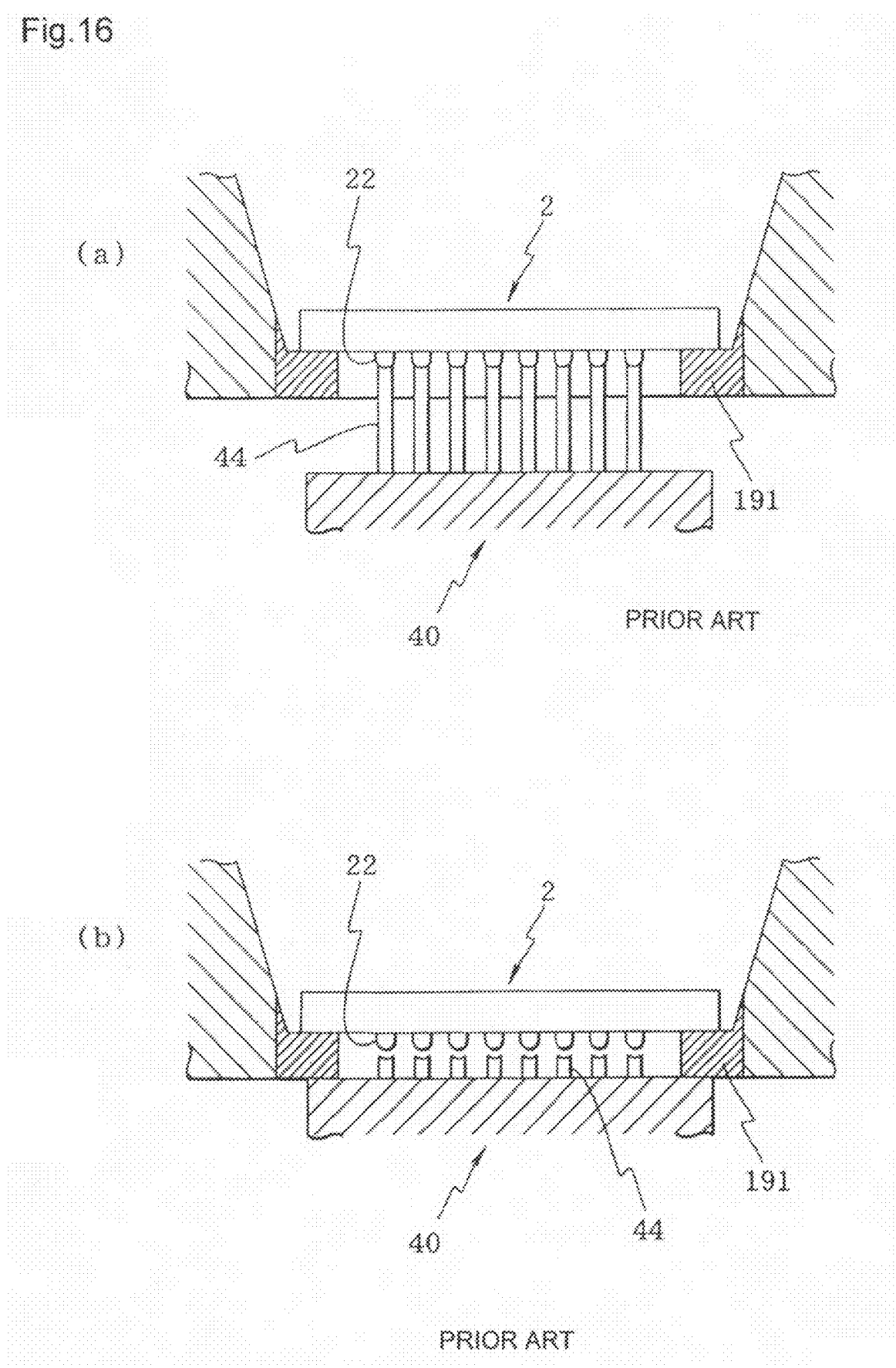
FIG. 16 is a sectional view of a part showing a connection state of external terminals of an IC device and connection terminals of a socket when using a conventional insert ((a) shows a connection state when the connection terminals protruding from the socket is long, and (b) shows when the connection terminals protruding from the socket is short).
Figure 17:
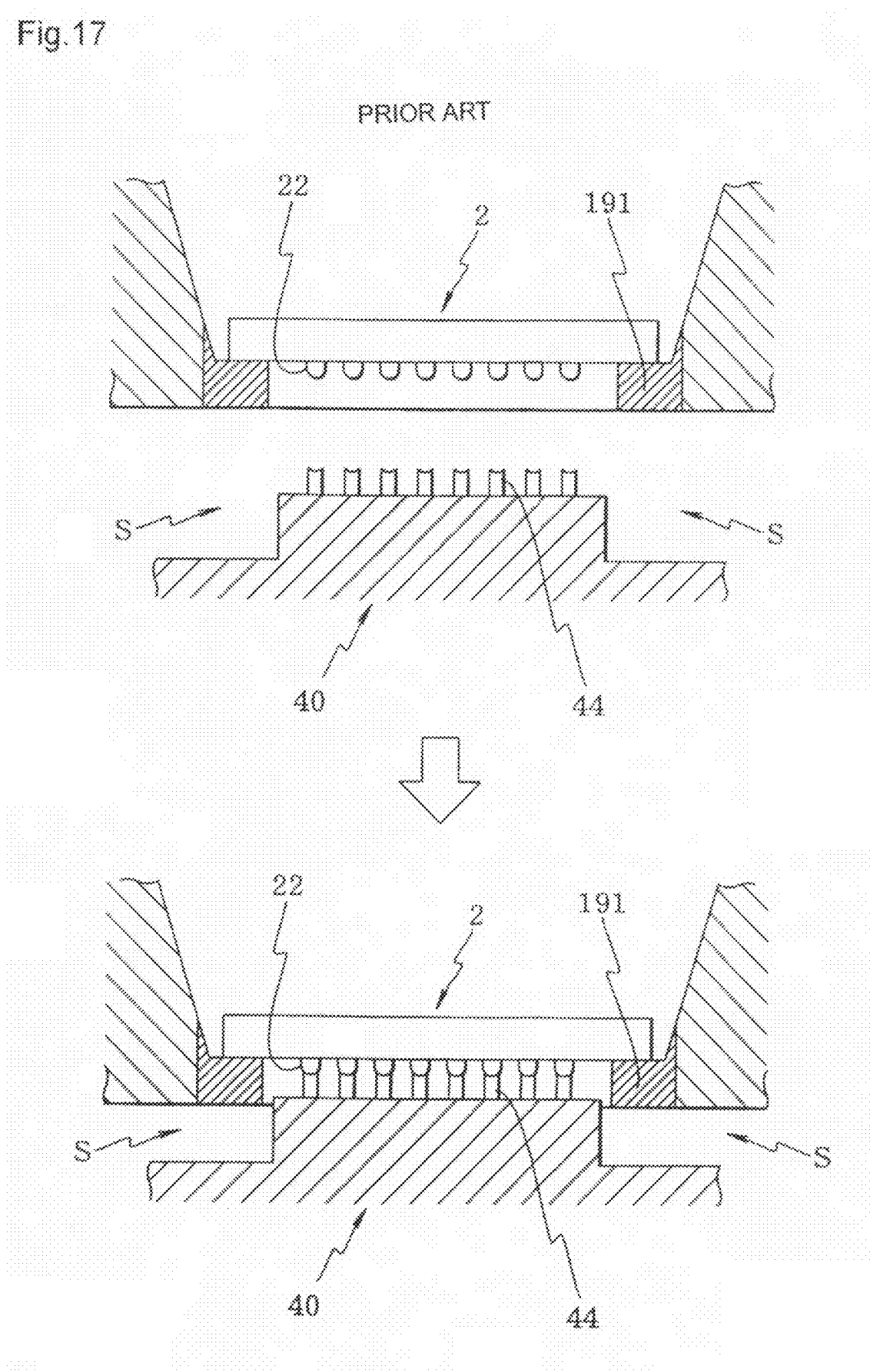
FIG. 17 is a sectional view of a part showing a connection state of external terminals of an IC device and connection terminals of a socket when using a conventional insert.

The IC device 2 is supported and held in the IC magazine 19 as a result that an external terminal face 23 thereof is supported by a rim of the opening portion 163*a* of the thin plate 163. As shown in FIG. 9, the thin plate 163 is attached to the insert body 161 so as to face a connection terminal face 42 of the socket 40 (refer to FIG. 14) when the external terminals 22 of the IC device 2 and the connection terminals 44 of the socket 40 are connected, and the IC magazine 19 can support and hold the IC device 2 so that the external terminals 22 of the IC device 2 face to the direction of the connection terminal 44 of the socket 40. Also, as shown in FIG. 8 and FIG. 9, the space 161*b* of the insert body 161 and the opening portion 163*a* of the thin plate 163 are connected, and the external terminals 22 of the IC device 2 held in the IC magazine 19 are exposed to the direction of the connection terminals 44 of the socket 40 through the opening 163*a* of the thin plate 163. Note that as shown in FIG. 14 ((*a*) is a view from the above of the socket 40 and (*b*) is a sectional view of a part of the socket 40), the upper surface 42 on which the connection terminals 44 are exposed among outer surfaces of the socket body 40 corresponds to the connection terminal face of the socket 40.

The opening portion 163 of the thin plate 163 is formed to correspond to a position of the external terminals 22 of the IC device 2. In the present embodiment, opening portion 163*a* on the thin plate 163 is formed one for all of the external terminals 22 of the IC device 2, but a size, number and position, etc. of the opening portion 163*a* are not particularly limited as far as it can support the external terminal face 23 of the IC device 2 by a rim thereof.

As shown in FIG. 10, when the IC device 2 held in the insert 16 is pressed in the direction of the connection terminals 44 of the socket 40 by the pressing tab 31 of the pusher, the thin plate 163 supporting the IC device 2 positions between the external terminal face 23 of the IC device 2 and the connection terminal face 42 of the socket 40. As a result, the insert 16 can hold wide-ranging kinds of IC devices without being constrained by the configuration (for example, a size and shape, etc.) of the connection terminal face 42 of the socket 40.

Also, as shown in FIG. 10, a thickness of the thin plate 163 is adjusted so that tip portion (corresponding to the "contact portion of external terminals") of the external terminals 22 of the IC device 2 to be in contact with the connection terminals 44 of the socket 40 is exposed from the thin plate 163 to the direction of the connection terminals 44. Namely, the thickness of the thin plate 163 is adjusted to be thinner than a distance between the tip portion of the external terminals 22 of the IC device 2 and the external terminal face 23 of the IC device 2. Therefore, the external terminals 22 of the IC device 2 and the connection terminals 44 of the socket 40 can be certainly connected.

The thickness of the thin plate 163 may be changed in a range of not hindering the connection between the external terminals 22 of the IC device 2 and the connection terminals 44 of the socket 40 and, as shown in FIG. 11, it is also possible to adjust the thickness of the thin plate 163 to be approximately equal to the distance between the tip portions of the external terminals 22 of the IC device 2 and the external terminal face 23 of the IC device 2. At this time, the thin plate 163 contacts both the external terminal face 23 and the connection terminal face 42, and it is possible to prevent an unnecessarily excessive pressing force from imposing on the external terminals 22 and the connection terminals 44. Namely, stroke management of the pusher 30 is possible by the thin plate 163. Note that in the example shown in FIG. 11, the connection terminals 44 are slightly protruding from the connection terminal face 42 of the socket 40.

As shown in FIG. 8 and FIG. 9, on both sides of the insert 16 are formed guide holes 20, to which a guide pin 32 of a pusher 30 is inserted from above and a guide bush 411 of a socket guide 41 is inserted from below, respectively, and at corner portions on both sides of the insert 16 are formed mounting holes 21 for mounting tabs 14 of a test tray TST.

As shown in FIG. 8 and FIG. 9, guide holes 20 on the insert 16 are for alignment. For example, when using the guide hole 20 on the left side in the figure for aligning and making the inner diameter smaller than that of the guide hole 20 on the right side, an upper half of the guide hole 20 on the left is inserted the guide pin 32 of the pusher 30 for aligning and a lower half thereof is inserted the guide bush 411 of the socket guide 41 for aligning. On the other hand, the guide hole 20 on the right side of the figure is in a loosely fit state with the guide pin 32 of the pusher 30 and the guide bush 411 of the socket guide 41.

As shown in FIG. 8, a socket board 50 is arranged on the test head 5. The socket board 50 can be arranged by the number corresponding to the IC devices 2, for example, in a total of four rows in every three rows in the line direction (4 lines×4 rows) on the test tray TST shown in FIG. 6, alternately, when a size of each socket board 50 can be made small, the socket board 50 may be arranged by 4 lines×16 rows on the test head 5, so that all IC devices 2 carried on the test tray TST shown in FIG. 6 can be tested at a time.

As shown in FIG. 8, a socket 40 is provided on the socket board 50 and, as shown in FIG. 8 and FIG. 9, a socket guide 41 is fixed on the socket 40 so that connection terminals 44 of the socket 40 are exposed. The connection terminals 44 of the socket 40 are probe pins and provided by the number and at positions corresponding to the external terminals 22 of the IC device 2 and biased in the upward direction by a not shown spring. On both sides of the socket guide 41 are provided with guide bushes 411 to which two guide pins 32 formed on the pusher 30 are inserted for aligning with the two guide pins 32.

The pusher 30 shown in FIG. 8 and FIG. 9 is provided on top of the test head 5 by the number corresponding to the number of sockets 40 and able to move up and down in the Z-axis direction by a not shown Z-axis drive (for example, a fluid pressure cylinder). As shown in FIG. 8 and FIG. 9, at the approximate center of the pusher 30 is formed a pressing tab 31 for pressing the IC device to be tested 2, and on both sides thereof, guide pins 32 to be inserted to the guide holes 20 of the insert 16 and the guide bushes 411 of the socket guide 40 are provided. Also, as shown in FIG. 8 and FIG. 9, between the pressing tab 31 and the guide pin 32 is provided with a stopper guide 33 for controlling the lower limit at the time the pusher 30 is lowered by the Z-axis drive, and as a result that the stopper guide 33 contacts the stopper face 412 of the socket guide 40, the lower limit position of the pusher 30 for pressing with a suitable pressure of not breaking the IC device to be tested 2 held in the insert 16 is determined.

Fourthly, a part relating to the unloader section 400 will be explained.

The unloader section 400 shown in FIG. 2 and FIG. 3 is provided with an X-Y conveyor 404 having the same configuration with that of the X-Y conveyor 304 provided to the loader section 300. Post-test IC devices are reloaded from the test tray TST conveyed out to the unloader section 400 to a customer tray KST by the X-Y conveyor 404.

As shown in FIG. 2, a device substrate 105 of the unloader section 400 is provided with two pairs of windows 406 and 406 arranged so that the customer trays KST carried to the unloader section 400 can be brought close from below.

Further, while not illustrated, an elevator table for elevating or lowering a customer tray KST is provided below the respective openings 406. A customer tray KST becoming full after being reloaded with the post-test IC devices is placed on here and lowered and the full tray is passed to the tray transfer arm 205.

The embodiments explained above are described to facilitate understanding of the present invention and is not to limit the present invention. Accordingly, respective elements disclosed in the above embodiments include all design modifications and equivalents belonging to the technical scope of the present invention.

In the above embodiments, for example, modifications below can be made.

Figure 12:
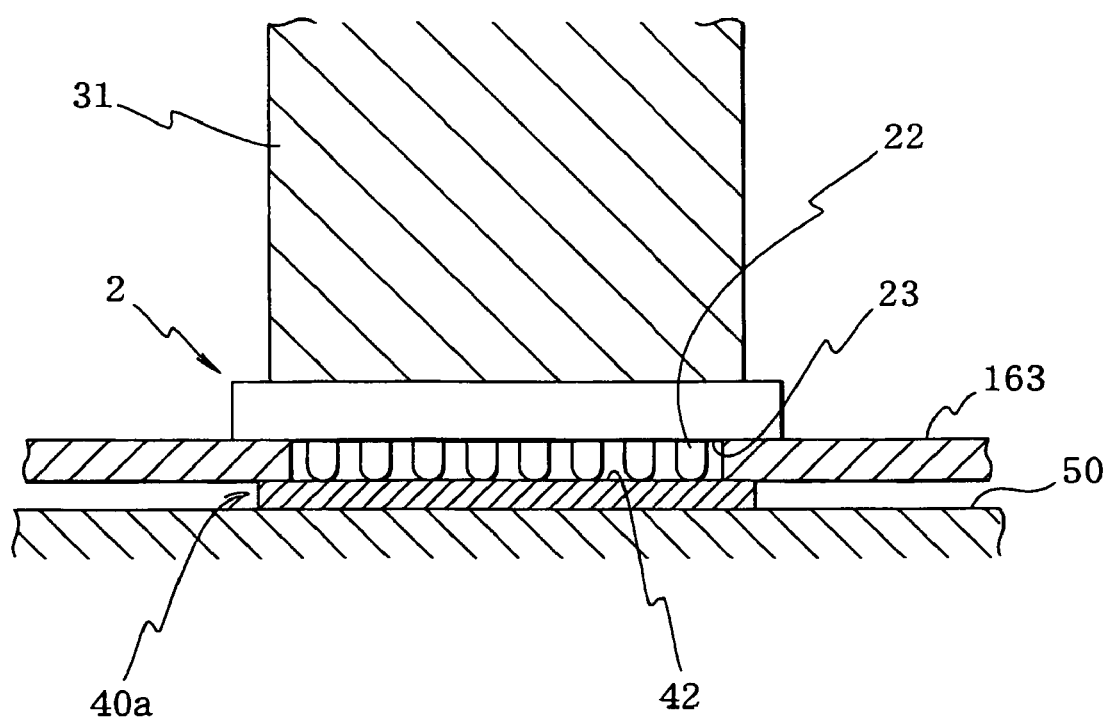
FIG. 12 is a sectional view of a part showing a connection state of external terminals of the IC device and connection terminals of the socket in the case of using a sheet shaped socket as a socket.

For example, the socket 40 can be changed to the sheet shaped socket 40a as shown in FIG. 12. Note that the same reference numbers as those in FIG. 10 and FIG. 11 indicate the same members or parts unless otherwise noted. On the sheet shaped socket 40a, connection terminals are not protruding as shown in FIG. 12, and the external terminals 22 of the IC device 2 are electrically connected by directly contacting a connection terminal face 42 of the sheet shaped socket 40a, so that electric resistance is small and a reduction of the test time of the IC device 2 and high speed processing become possible. Accordingly, an IC device testing apparatus using the sheet shaped socket 40a is particularly useful for a high frequency test.

Also, the external terminals 22 of the IC device 2 can be brought to directly contact pads on a wiring substrate, such as a socket board 50. At this time, the socket board 50 or other wiring substrate corresponds to the "socket", and the pads on the wiring substrate correspond to the "connection terminals of the socket".

Figure 18:
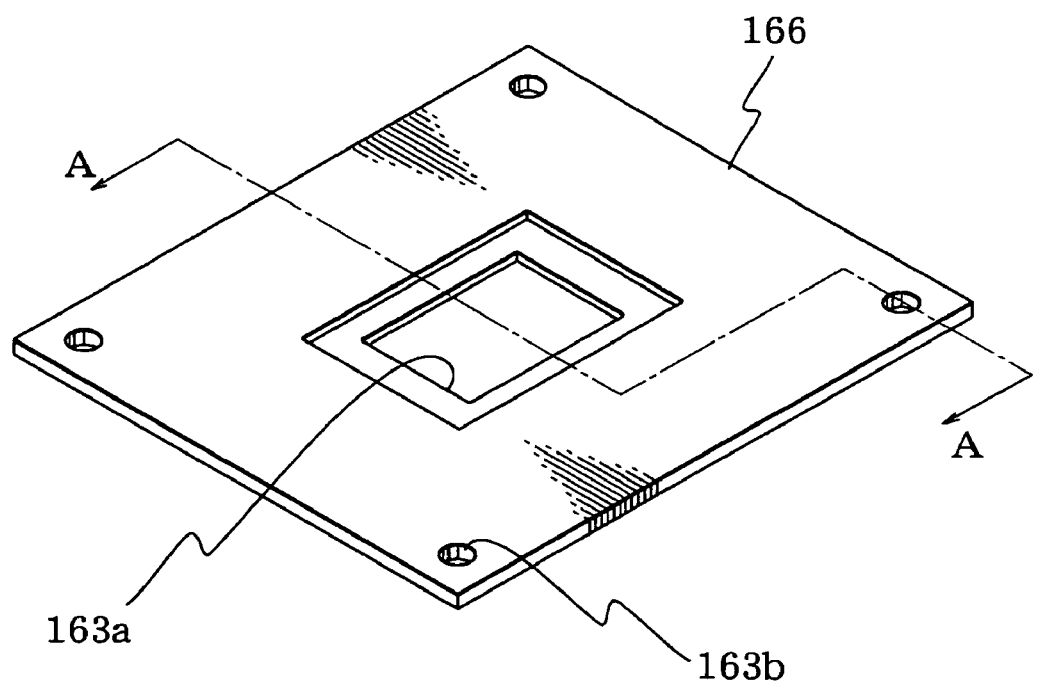
FIG. 18 is a perspective view of a plate member, which can be used instead of using a thin plate in the insert according to the present invention.
Figure 18:
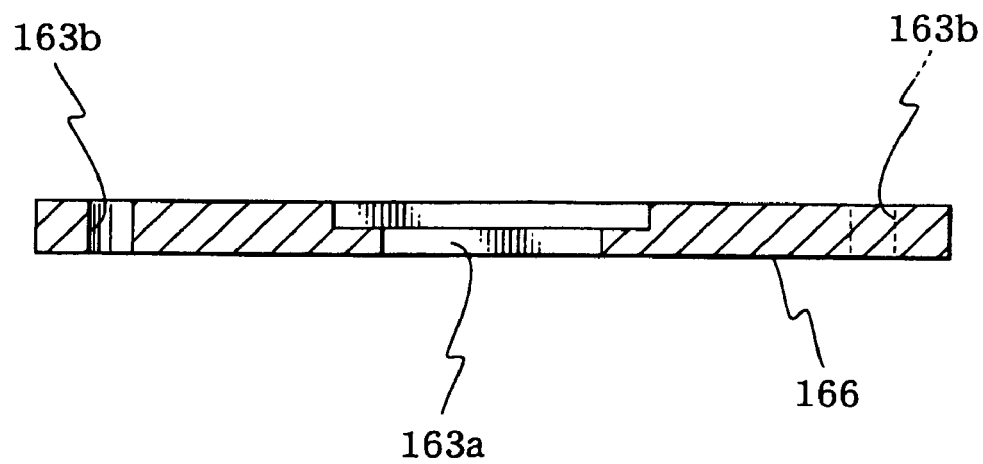

Also, the thin plate 163 can be changed to a plate member 166 as shown in FIG. 18. Note that, in FIG. 18, the same part as the thin plate 163 is given the same reference number and an explanation thereon is omitted unless needed. FIG. 18(a) is a perspective view of the plate member 166, and (b) is a sectional view along the line A-A in (a). As shown in FIG. 18, a thickness of the rim of the opening portion 163a for supporting the external terminal face 23 of the IC device 2 is made to be the same thickness as that of the thin plate 163 in the plate member 166, but a thickness of other part is made thicker than the thickness of the thin plate 163 so that it can keep enough strength as an insert.

Furthermore, the IC device testing apparatus 10 is not limited to the chamber type explained in the above embodiments and may be, for example, a chamberless type or a heat-plate type.

INDUSTRIAL APPLICABILITY

According to the present invention, firstly, an insert capable of holding wide-ranging kinds of area array type electronic components without being constrained the kind of an area array type electronic component to be held in the insert by the configuration (for example, a size and shape, etc.) of a connection terminal face of a socket, and an electronic component handling apparatus and an electronic component testing method using the same are provided. Also, according to the present invention, secondary, an insert wherein, even if a space for a supporting portion for supporting an external terminal face of an area array type electronic component to slip to is not provided around the connection terminal face of the socket when the external terminals of the area array type electronic component and the connection terminals of the socket are connected, the supporting portion and the connection terminal face of the socket are not interfered from each other and certain connection is realized between the external terminals of the area array type electronic component and connection terminals of the socket, and an electronic component handling apparatus and an electronic component testing method using the same are provided.

The invention claimed is:

1. An insert attachable to an insert magazine of a tray for holding an area array type electronic component to be tested, comprising:
   a supporting portion for supporting an external terminal face of the area array type electronic component to orient and expose external terminals of the area array type electronic component in a direction facing connection terminals of a socket, wherein
   a thickness of the supporting portion is approximately equal to or less than a distance between a contact portion of the external terminals of the area array type electronic component and the external terminal face of the area array type electronic component, and
   the supporting portion is provided to be positioned between the external terminal face of the area array type electronic component and the connection terminal face of the socket when the external terminals of the area array type electronic component and the connection terminals of the socket are connected.

2. The insert as set forth in claim 1, wherein the supporting portion is configured by a thin plate.

3. The insert as set forth in claim 1, wherein a plate member comprising the supporting portion is provided to the insert so as to face the connection terminal face of the socket.

4. The insert as set forth in claim 3, wherein a supporting portion part or whole of the plate member is configured by a thin plate.

5. The insert as set forth in claim 3, wherein the plate member has an opening portion for exposing the external terminals of the area array type electronic component to the direction of the connection terminals of the socket, and can support the external terminal face of the area array type electronic component by a rim of the opening portion.

6. The insert as set forth in claim 5, wherein the rim of the opening portion of the plate member is configured by a thin plate.

7. The insert as set forth in claim 3, wherein the plate member is attached to an insert body as a separate member from the insert body.

8. The insert as set forth in claim 3, wherein the plate member is configured by a metal plate.

9. The insert as set forth in claim 1, being attached to a tray for carrying an electronic component to be tested to and from a contact portion of a test head of an electronic component testing apparatus.

10. An electronic component testing method for conducting a test on an area array type electronic component, comprising
   inserting the area array type electronic component into a testing tray,
   supporting an external terminal face of the area array type electronic component by a rim of an opening portion of a plate member located on the testing tray and having the opening portion,
   pressing the area array type electronic component in the direction of connection terminals of a socket in a state that external terminals of the area array type electronic component are exposed from the opening portion to the direction of the connection terminals of the socket, and
   connecting the external terminals of the area array type electronic component with the connection terminals of the socket,
   wherein
   a thickness of the rim of the opening portion of the plate member is approximately equal to or less than a distance between a contact portion of the external terminals of the area array type electronic component and the external terminal face of the area array type electronic component, and
   the plate member is positioned between the external terminal face of the area array type electronic component and the connection terminal face of the socket when the external terminals of the area array type electronic component and the connection terminals of the socket are connected.

11. The insert as set forth in claim 1, further comprising a plurality of inserts selectively attachable to the insert magazine of the tray each for holding an area array type electronic component to enable the area array type electronic component to be tested simultaneously with other array type electronic components.

12. The method of claim 10, wherein the inserting of the area array type electronic component into a testing tray comprises inserting a plurality of area array type electronic components into a testing tray.

13. An electronic component handler for an electronic component testing apparatus, comprising:
   a test tray including an insert magazine;
   an insert selectively attachable to the insert magazine of the test tray for holding an area array type electronic component to be tested, the insert including a supporting portion for supporting an external terminal face of the area array type electronic component to orient and expose external terminals of the area array type electronic component in a direction facing connection terminals of a socket, wherein
   a thickness of the supporting portion is approximately equal to or less than a distance between a contact portion of the external terminals of the area array type electronic component and the external terminal face of the area array type electronic component, and the supporting portion is provided to be positioned between the external terminal face of the area array type electronic component and the connection terminal face of the socket when the external terminals of the area array type electronic component and the connection terminals of the socket are connected.

14. The electronic component handler as set forth in claim 13, further comprising a plurality of inserts selectively attachable to the insert magazine of the tray each for holding an area array type electronic component to enable the area array type electronic component to be tested simultaneously with other array type electronic components.

* * * * *